United States Patent [19]
Nakanishi et al.

[11] Patent Number: 5,489,789
[45] Date of Patent: Feb. 6, 1996

[54] SEMICONDUCTOR DEVICE

[75] Inventors: Hidetoshi Nakanishi, Kawasaki; Yasunori Usui, Yokohama, both of Japan

[73] Assignee: Kabushiki Kaisha Toshiba, Kawasaki, Japan

[21] Appl. No.: 417,471

[22] Filed: Apr. 5, 1995

Related U.S. Application Data

[63] Continuation of Ser. No. 203,377, Mar. 1, 1994, abandoned.

[30]  Foreign Application Priority Data

Mar. 1, 1993 [JP] Japan ................... 5-039949

[51] Int. Cl.$^6$ .................. H01L 29/74; H01L 31/111; H01L 29/76; H01L 29/94
[52] U.S. Cl. ................. 257/138; 257/139; 257/328; 257/140
[58] Field of Search .................. 257/328, 329, 257/138, 139, 140, 141, 144, 127

[56]  References Cited

U.S. PATENT DOCUMENTS

| | | | |
|---|---|---|---|
| 4,779,123 | 10/1988 | Bencuya et al. | 257/144 |
| 5,095,343 | 3/1992 | Klodzinski et al. | 257/328 |
| 5,155,569 | 10/1992 | Terashima . | |

FOREIGN PATENT DOCUMENTS

| | | | |
|---|---|---|---|
| 0438700 | 7/1991 | European Pat. Off. . | |
| 0476815 | 3/1992 | European Pat. Off. . | |
| 0507974 | 10/1992 | European Pat. Off. . | |
| 4207569 | 9/1992 | Germany | 257/139 |
| 63-310171 | 12/1988 | Japan . | |
| 91/03078 | 3/1991 | WIPO | 257/139 |

OTHER PUBLICATIONS

ISPSD'91, The Base Resistance Controlled Thyristor (BRT), 1991, Apr. 22–24, pp. 138–141, M. Nandakumar, et al.
Patent Abstracts of Japan, vol. 16, No. 332 (E–1236), JP–A–4 099 384, Mar. 31, 1992.

*Primary Examiner*—Stephen D. Meier
*Attorney, Agent, or Firm*—Oblon, Spivak, McClelland, Maier & Neustadt

[57]  ABSTRACT

A P type source region is formed in a grid mesh-like pattern in one major surface portion of an N$^-$ type semiconductor substrate. A P type base region and P$^-$ type base region are each formed in the one major surface portion of the N$^-$ type semiconductor substrate at an area between those grid mesh-like portions of the P type source region. An N type emitter region is formed in the P type base region. An N type emitter region is formed in the P$^-$ type base region. A gate electrode is formed over the P type source region, N$^-$ type semiconductor substrate, P type base region and P$^-$ type base region. The gate electrode is formed in a grid mesh-like pattern as viewed from above the N$^-$ type semiconductor substrate. A cathode electrode is contacted with the P type source region, P$^-$ type base region and N type emitter regions. A P$^+$ type emitter layer is formed on an other major surface side of the N$^-$ type semiconductor substrate. An N$^+$ type buffer layer is formed between the N$^-$ type semiconductor substrate and the P$^+$ type emitter layer. An anode electrode is contacted with the P$^+$ type emitter layer. A cell acts as a switch at a turn-on time and a resultant MCT is rapidly turned on. Those cells α and β have such an arrangement as to improve the turn-off characteristic.

16 Claims, 27 Drawing Sheets

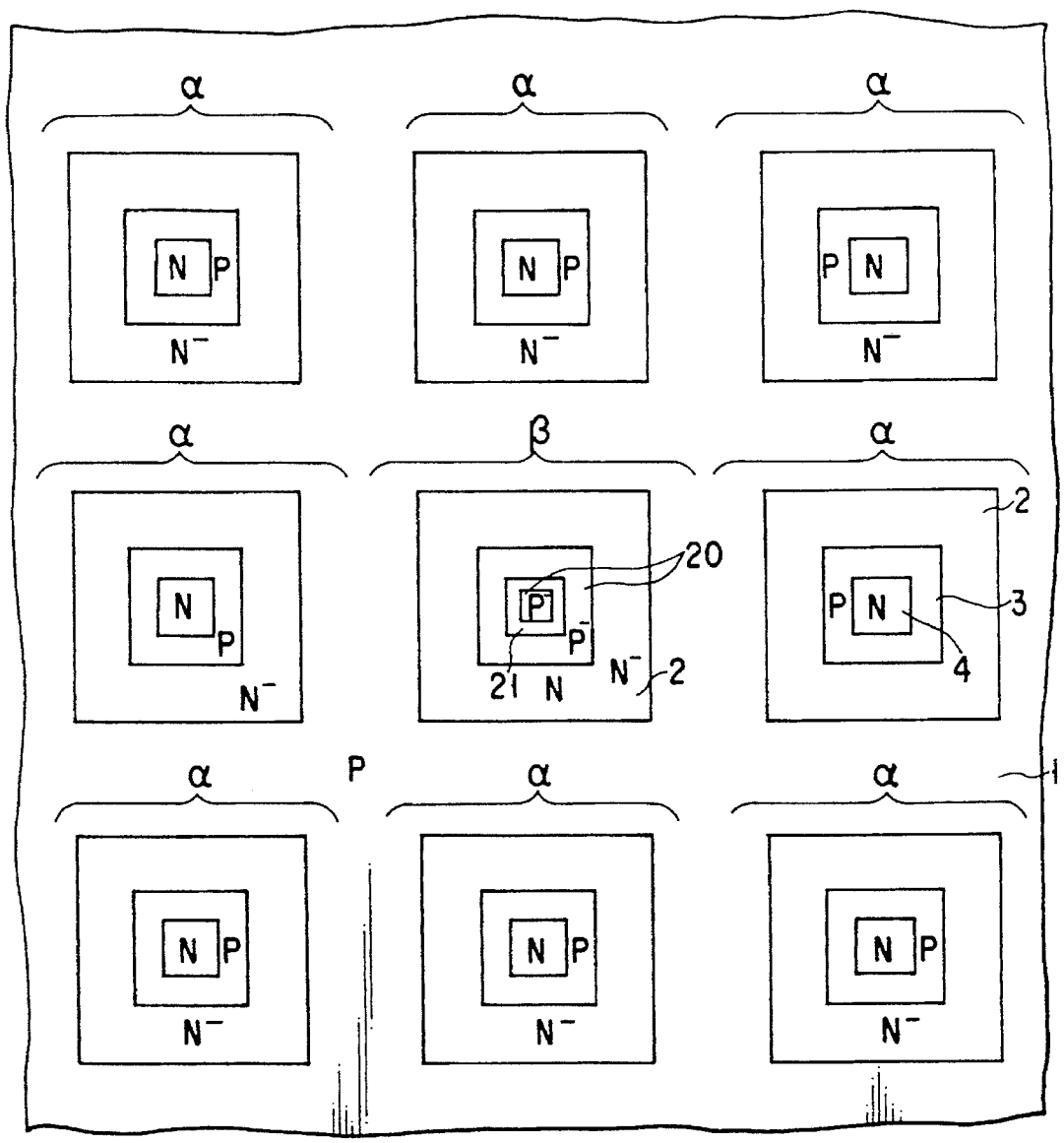
F I G. 7

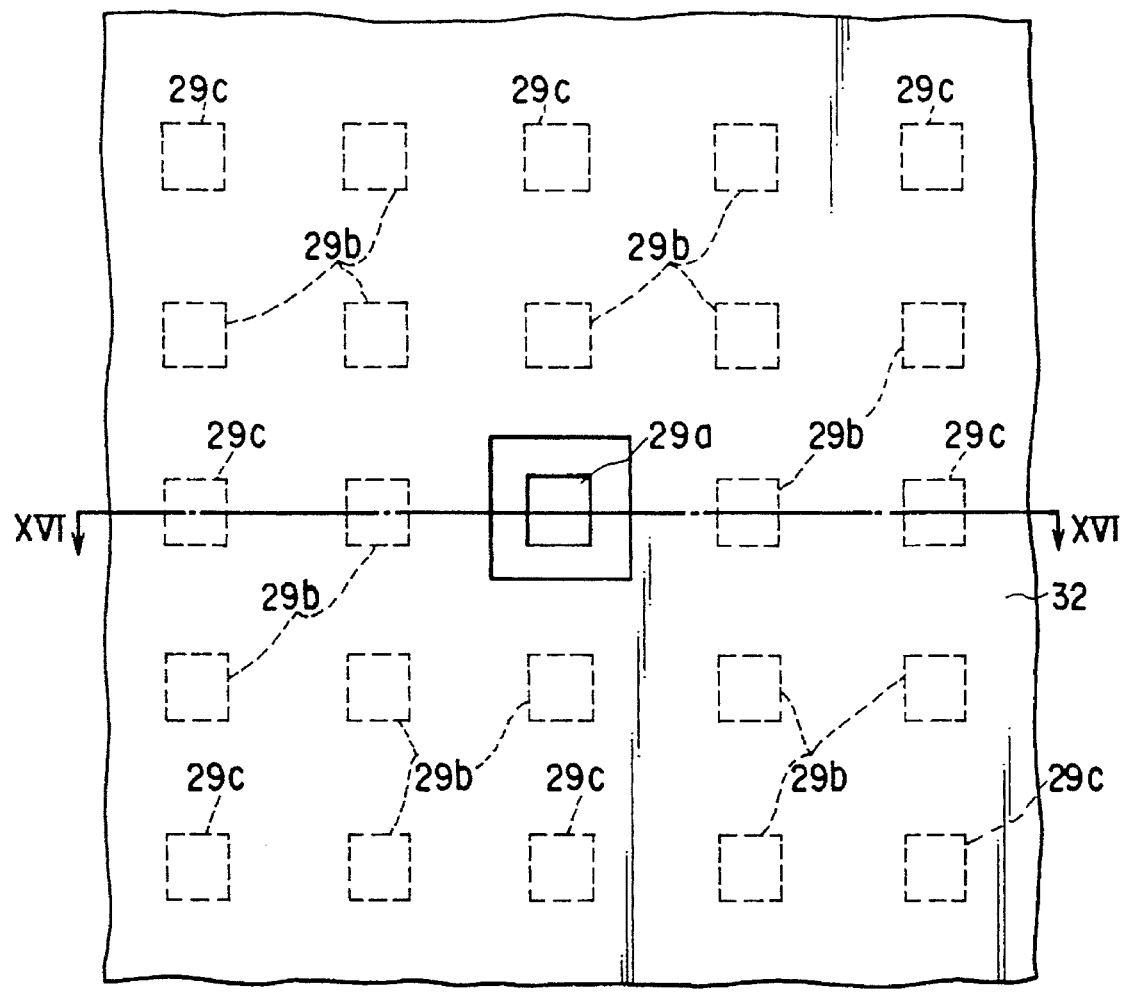
F I G. 15

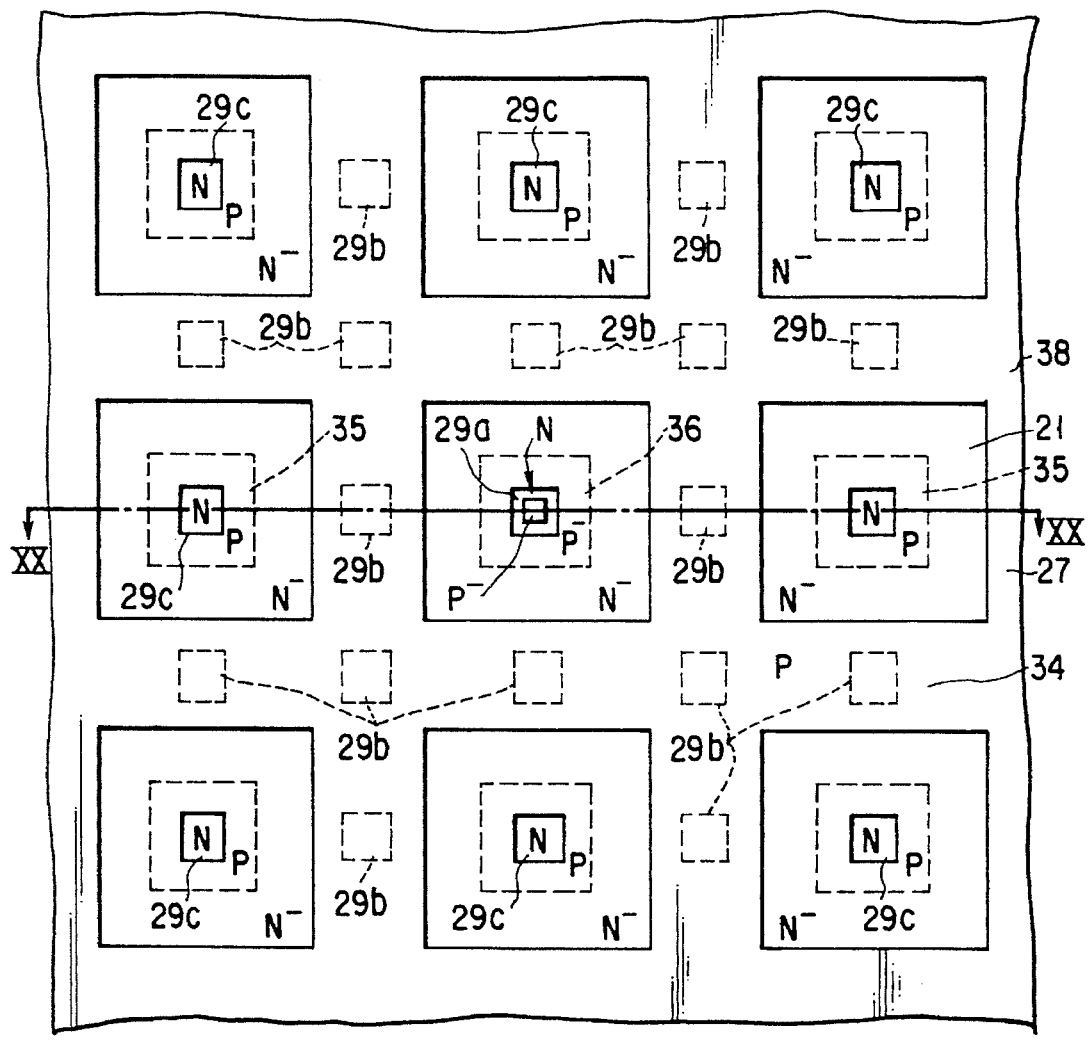
F I G. 19

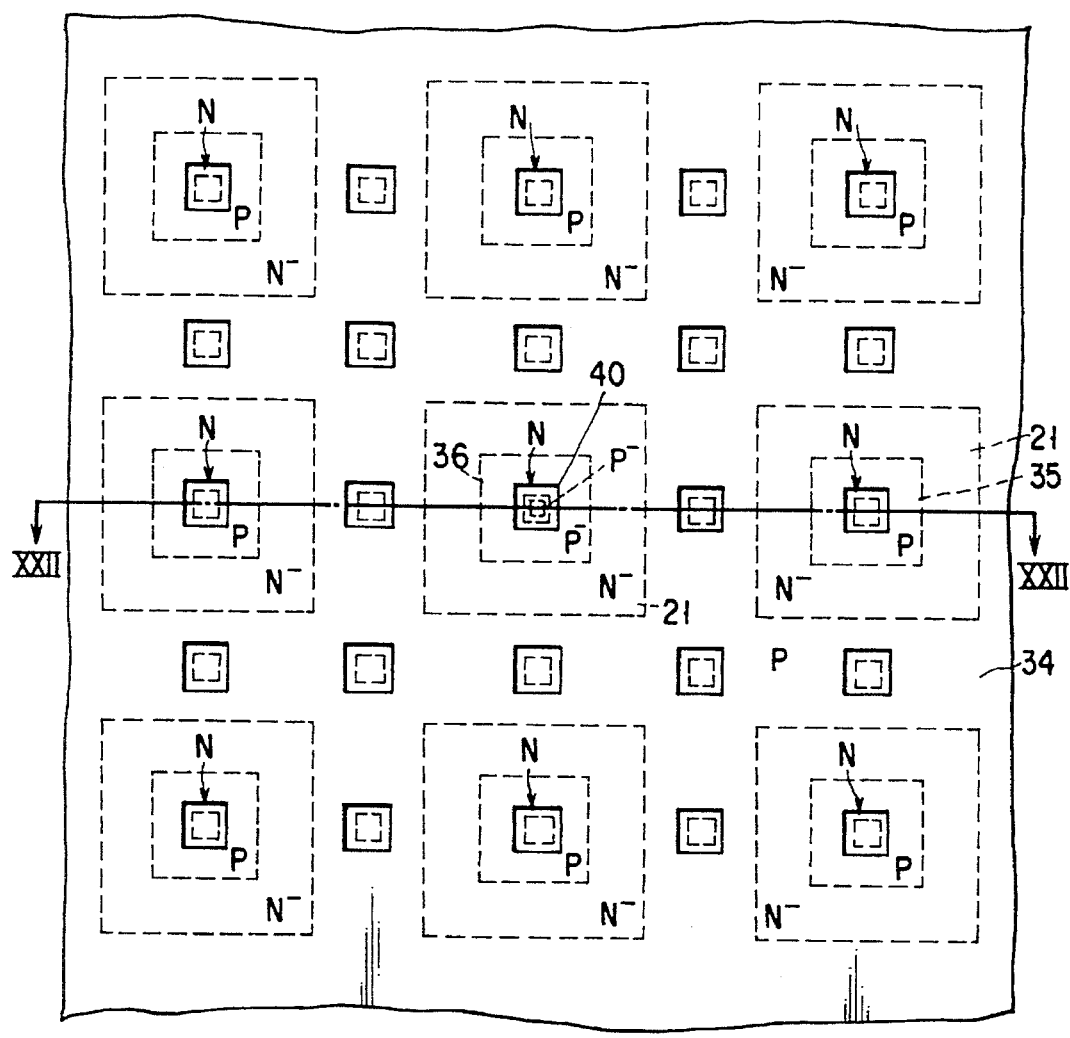
F I G. 21
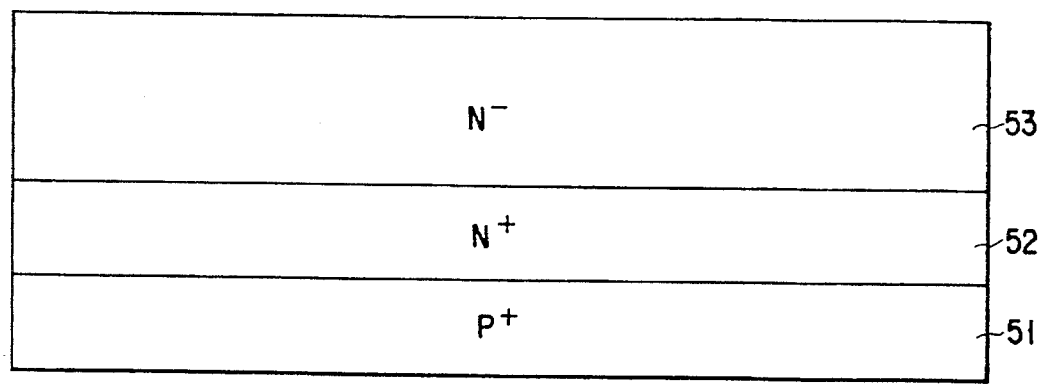
F I G. 23

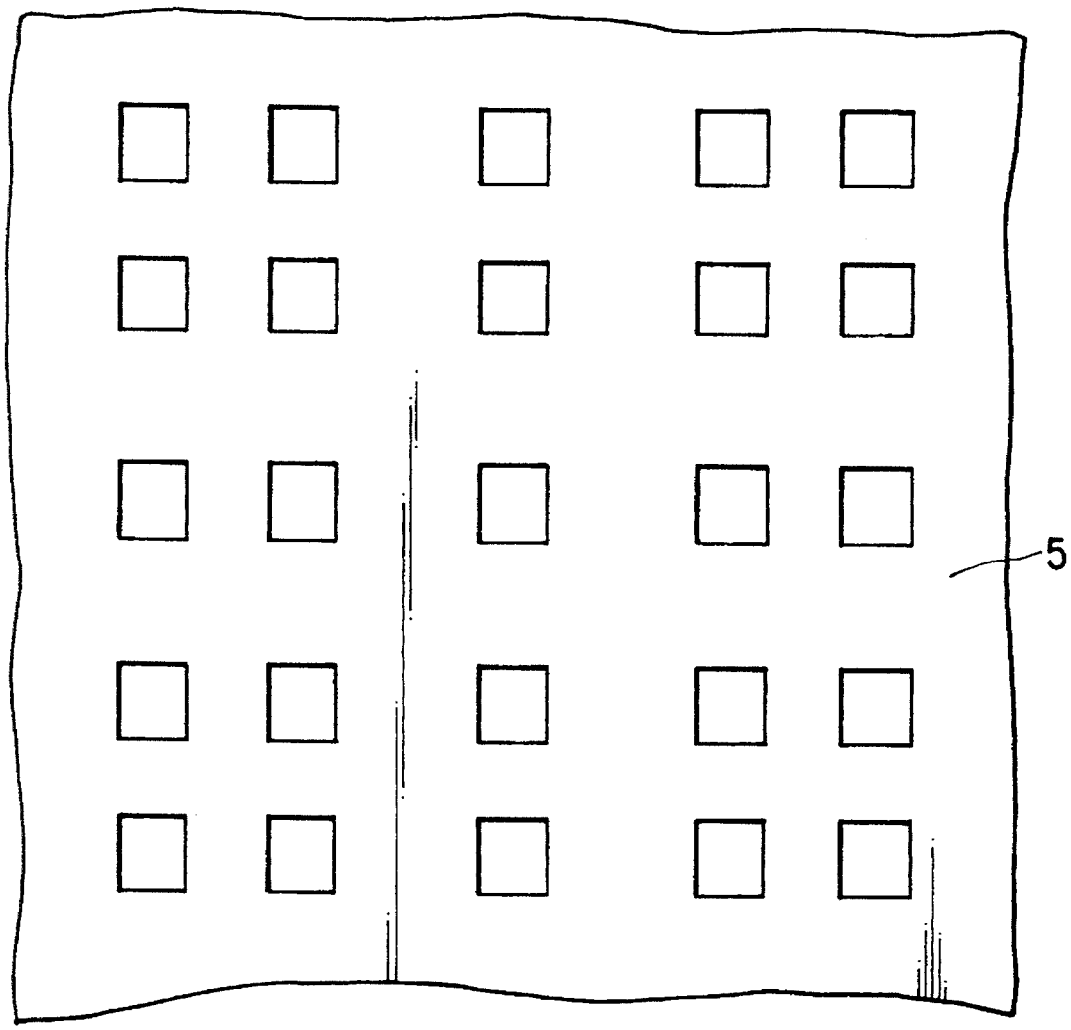
F I G. 25

SEMICONDUCTOR DEVICE

This application is a continuation of application Ser. No. 08/203,377, filed on Mar. 1, 1994, now abandoned.

BACKGROUND OF THE INVENTION

1. Field of the Invention

The present invention relates to an improvement in an MOS controlled thyristor (hereinafter referred to as an MCT) for turning on an MOS gate.

2. Description of the Related Art

FIG. 1 shows a conventional MCT, such as an MCT disclosed in JPN PAT APPLN KOKAI Publication 4-99384 (published on Mar. 31, 1992). FIG. 2 is a plan view showing diffusion layers formed in a substrate surface of an MCT of FIG. 1.

The arrangement of the MCT as shown in FIGS. 1 and 2 will be explained below.

A P type source region 1 is formed in a grid mesh-like pattern in a one-side surface of an $N^-$ type semiconductor substrate 2. P type base regions 3 are each formed in the one-side surface portion of the $N^-$ type semiconductor substrate 2 at an area between the P type source portions 3. An N type emitter region 4 is formed in the P type base region 3.

A polysilicon gate electrode 5 is formed over the $N^-$ type semiconductor substrate 2 with a gate insulating film 6 provided therebetween. One end of the polysilicon gate electrode 5 is situated in an overlying relation to the end of the emitter region 4 and the other end of the polysilicon gate electrode 5 is situated in an overlying relation to the P type source region 1.

An insulating film 7 covers the polysilicon electrode 5. A cathode electrode 8 is formed over the $N^-$ type semiconductor substrate 2 and is connected to the P type source region 1 and N type emitter region 4.

An $N^+$ buffer layer 9 is provided on the other surface side of the $N^-$ type semiconductor substrate 2. A $P^+$ type emitter layer 10 is formed adjacent to the $N^+$ buffer layer 9 and an anode electrode 11 is formed on the other surface of the $P^+$ type emitter layer 10.

FIGS. 3 and 4 show an operation (turn ON/turn OFF) principle for MCT in FIGS. 1 and 2.

Referring to FIG. 3, the operation of the MCT at a turn-on time will be explained below.

When the anode A and cathode K are biased positive and negative, respectively, with a gate G biased positive, an N channel inversion layer 12 is created at the surface of the P type base region 3. Electrons 13 are injected from the N type emitter region 4 through the N channel inversion layer 12 into the $N^-$ type base region (substrate) 2. When this occurs, holes are induced in the $P^+$ type emitter layer 10 and injected into the $N^-$ type base region 2. As a result, a conductivity modulation occurs in the $N^-$ type base region 2 and electrons 15 pass from the N type emitter region 4 into the $N^-$ type base region 2 via the P type base region 3. In this way, the MCT is turned on.

Referring to FIG. 4, the operation of the MCT at a turn off time will be explained below.

When the gate G is biased negative with respect to the cathode K in such a state that a main current 17 flows with the anode A and cathode K biased positive and negative, respectively, the N channel inversion layer created at the turn-on time disappears. Further, a P channel inversion layer 16 is created at that surface of the $N^-$ type base region 2 situated between the P type source region 1 and the P type base region 3. Since the P type source region 1, P type base region 3 and cathode electrode 8 are short-circuited by a P channel inversion layer 16 so that holes 18 in the main current 17 are discharged from the P type base region 3 through the P channel inversion layer 16 and P type source region 1 into the cathode electrode 8. As a result, the injection of the electrons from the N type emitter region 4 into the $N^-$ type base region 2 is stopped so that the main current 17 ceases to flow. In this way, the MCT is turned off.

The above-mentioned MCT has now been developed as a self-turn-off type element with its turn-off efficiency improved in preference to other efficiencies. In the prior art, in order to improve the turn-off characteristic, the concentration of the P type base region 3 is made at as high a level as possible, thus lowering the resistance at a hole current discharge path of P type base region 3→P channel inversion layer 16→P type source region 1 as created at the turn-off time.

If the concentration of the P type base region 3 is enhanced, the N channel inversion layer as required at the turn-on time is difficult to create, thus lowering the turn-on efficiency. Stated another way, the conventional MCT suffers a drawback in that the improving of the turn-off characteristic results in the lowering of the turn-on characteristic.

SUMMARY OF THE INVENTION

It is accordingly the object of the present invention to provide a semiconductor device capable of improving its turn-off characteristic, without degenerating its turn-on characteristic, so that it is possible to improve a trade-off between the turn-on characteristic and the turn-off characteristic of an MCT.

In order to achieve the above-mentioned object, a semiconductor device is provided, comprising:

a first semiconductor region of a first conductivity type;

a second semiconductor region of a second conductivity type formed in a grid- or a mesh-like pattern in a first major surface portion of the first semiconductor region;

a third semiconductor region of the second conductivity type formed in the first major surface portion of the first semiconductor region at an area between the grid or mesh portions of the second semiconductor region;

a fourth semiconductor region of the first conductivity type formed in the third semiconductor region;

a fifth semiconductor region of the second conductivity type formed in the first major surface portion of the first semiconductor region at an area between the grid or mesh portions of the second semiconductor region and at least having an impurity region lower than that of the third semiconductor region;

a sixth semiconductor region of the first conductivity type formed in the fifth semiconductor region;

a gate electrode formed over the first semiconductor region, second semiconductor region, third semiconductor region and fifth semiconductor region each with an insulating film therebetween;

a first electrode formed over the first major surface of the first semiconductor region and connected at least to the second, fourth, fifth and sixth semiconductor regions;

a seventh semiconductor region of the second conductivity type formed on a second major surface of the first semiconductor region; and a second electrode formed on the seventh semiconductor region.

According to the above-mentioned semiconductor device, between the grid mesh-like portions of the second semiconductor region the third semiconductor region and fifth semiconductor region are each formed, the fifth semiconductor region having an impurity concentration lower than that of the third semiconductor region. Further, the fourth semiconductor region and sixth semiconductor region are provided in the third semiconductor region and fifth semiconductor region, respectively. The first electrode is connected to the second, fourth, fifth and sixth semiconductor regions.

The semiconductor device thus arranged is rapidly turned on because a cell including the fifth and sixth semiconductor regions serves as a switch. Further, the semiconductor device above is rapidly turned off because the third semiconductor region can be made relatively high in its impurity concentration and because the first electrode is formed in contact with the fifth and sixth semiconductor regions. Consequently, it is possible to improve the turn-off characteristic of the semiconductor device, without degenerating the turn-on characteristic, so that an improved trade-off is provided between the turn-off characteristic and the turn-on characteristic.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view showing an operation mode when MCT in FIG. 1 is turned on;

FIG. 7 shows diffusion layers formed in the surface portion of the substrate in MCT in FIG. 5;

FIG. 9 is a view showing an operation when MCT in FIG. 5 is turned on;

FIG. 15 is another view showing an arrangement at a step of manufacturing MCT in FIG. 5;

FIG. 19 is another view showing an arrangement at a step of manufacturing MCT in FIG. 5;

FIG. 21 is another view showing an arrangement at a step of manufacturing MCT in FIG. 5;

FIG. 23 is another view showing an arrangement at a step of manufacturing MCT in FIG. 5;

FIG. 25 is a plan view showing a pattern of a gate electrode formed over a substrate of MCT in FIG. 24;

DETAILED DESCRIPTION OF THE PREFERRED EMBODIMENTS

Preferring to the drawings, the semiconductor device of the present invention will be explained in more detail below.

Figure 1:
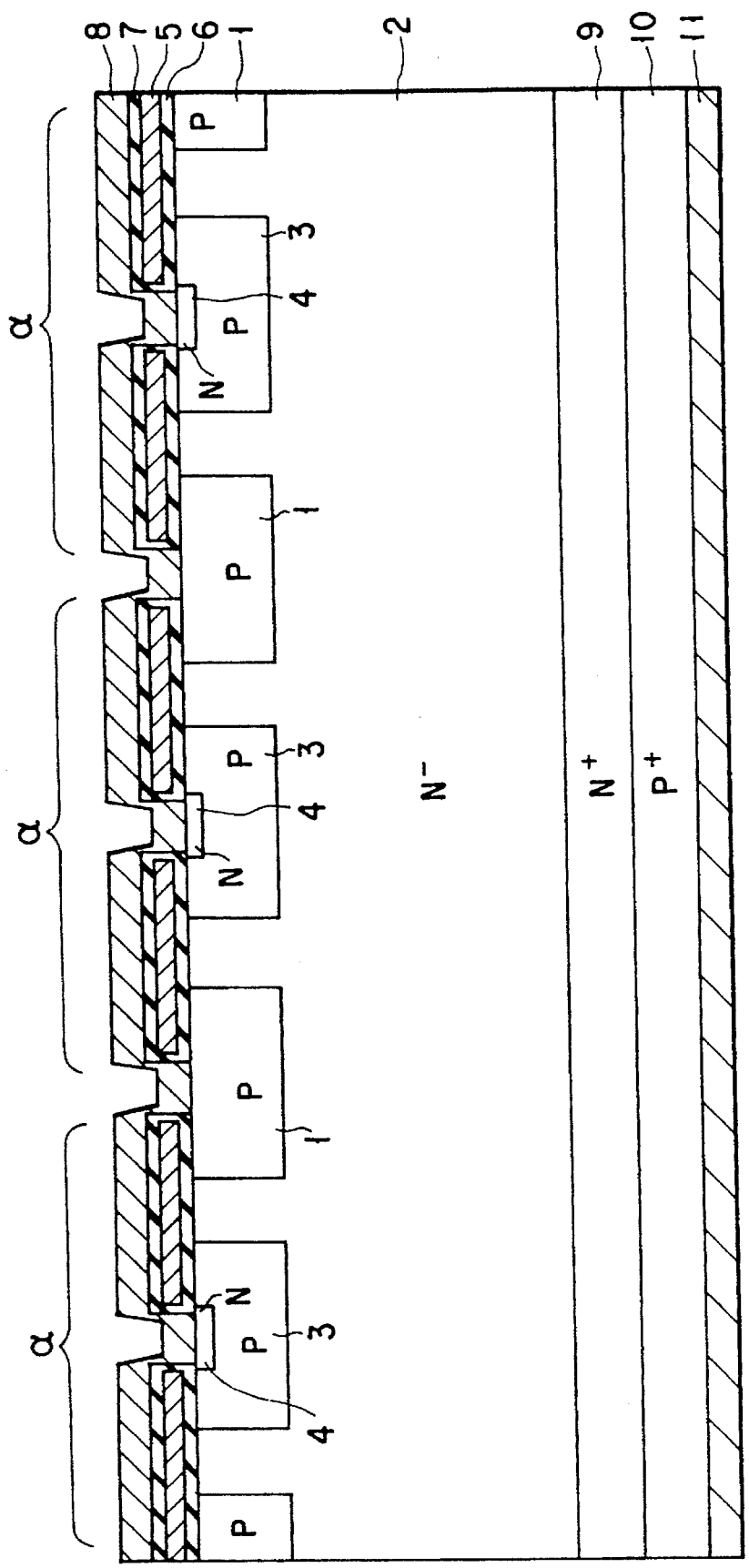
FIG. 1 is a cross-sectional view showing a conventional MCT.
Figure 2:
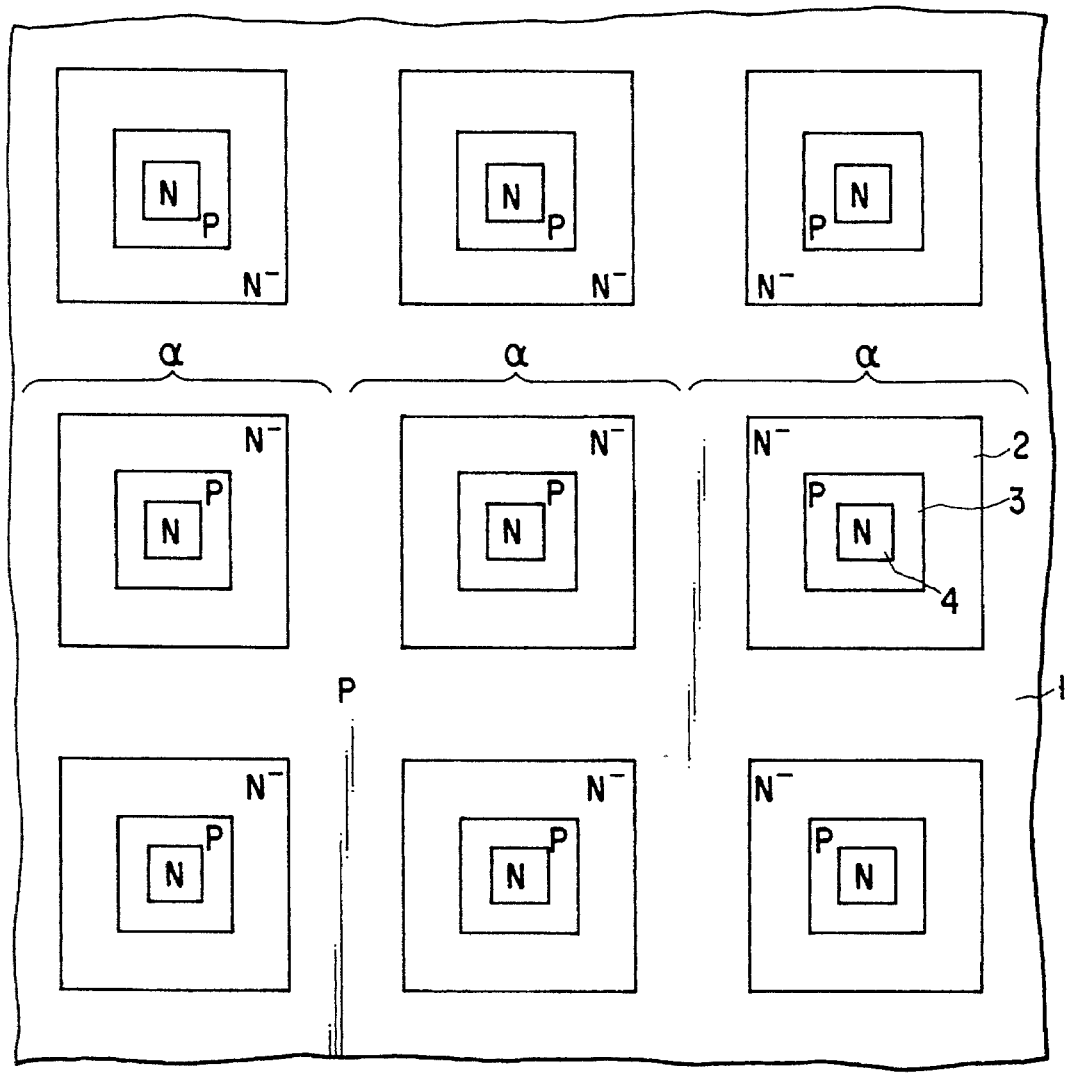
FIG. 2 is a plan view showing diffusion layers formed in the surface portion of a substrate of MCT shown in FIG. 1.
Figure 3:
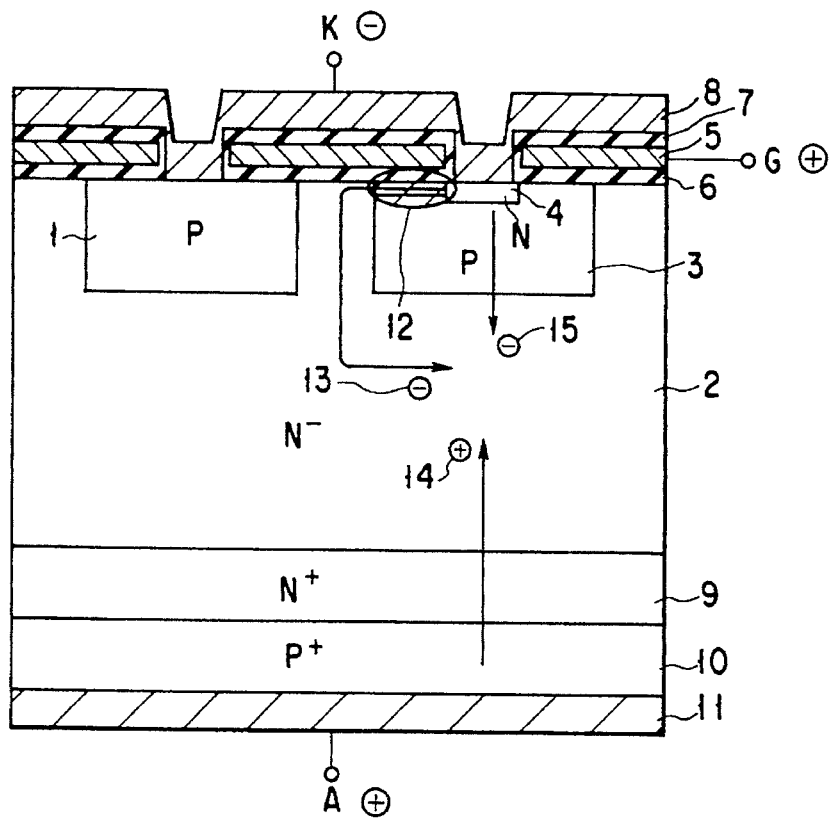
Figure 4:
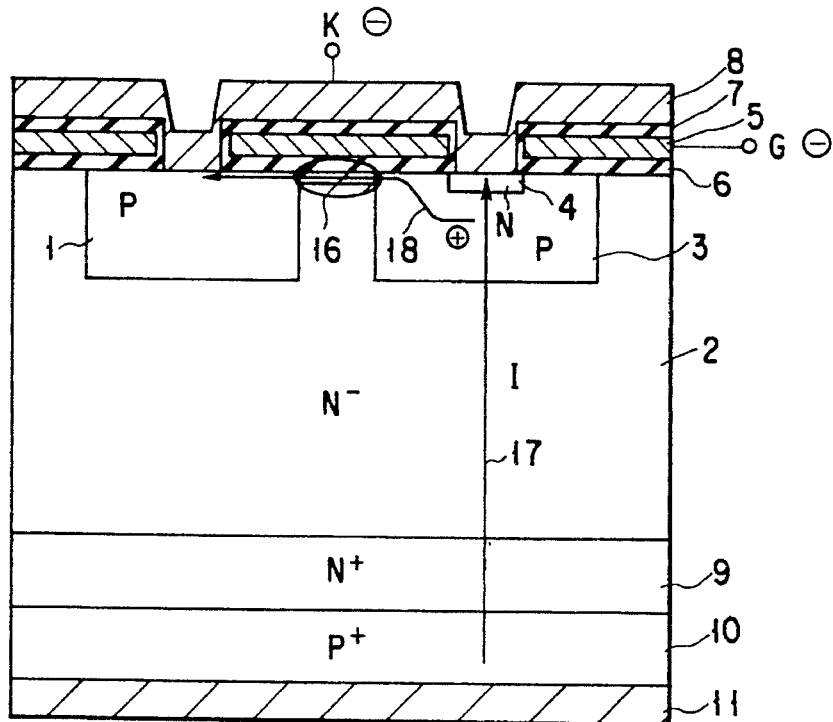
FIG. 4 is a view showing an operation mode when MCT in FIG. 1 is turned off.
Figure 5:
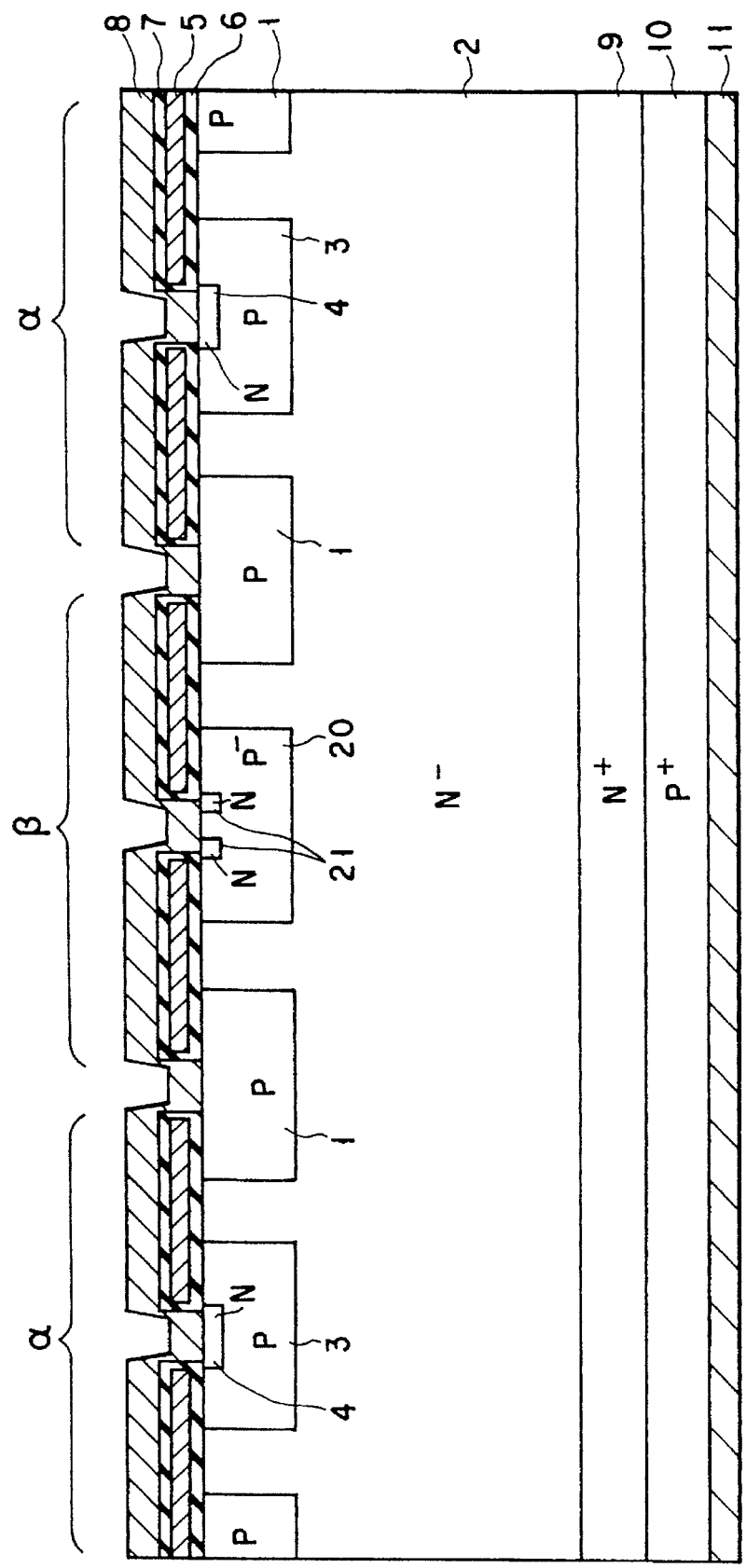
FIG. 5 is a cross-sectional view showing an MCT according to a first embodiment of the present invention.
Figure 6:
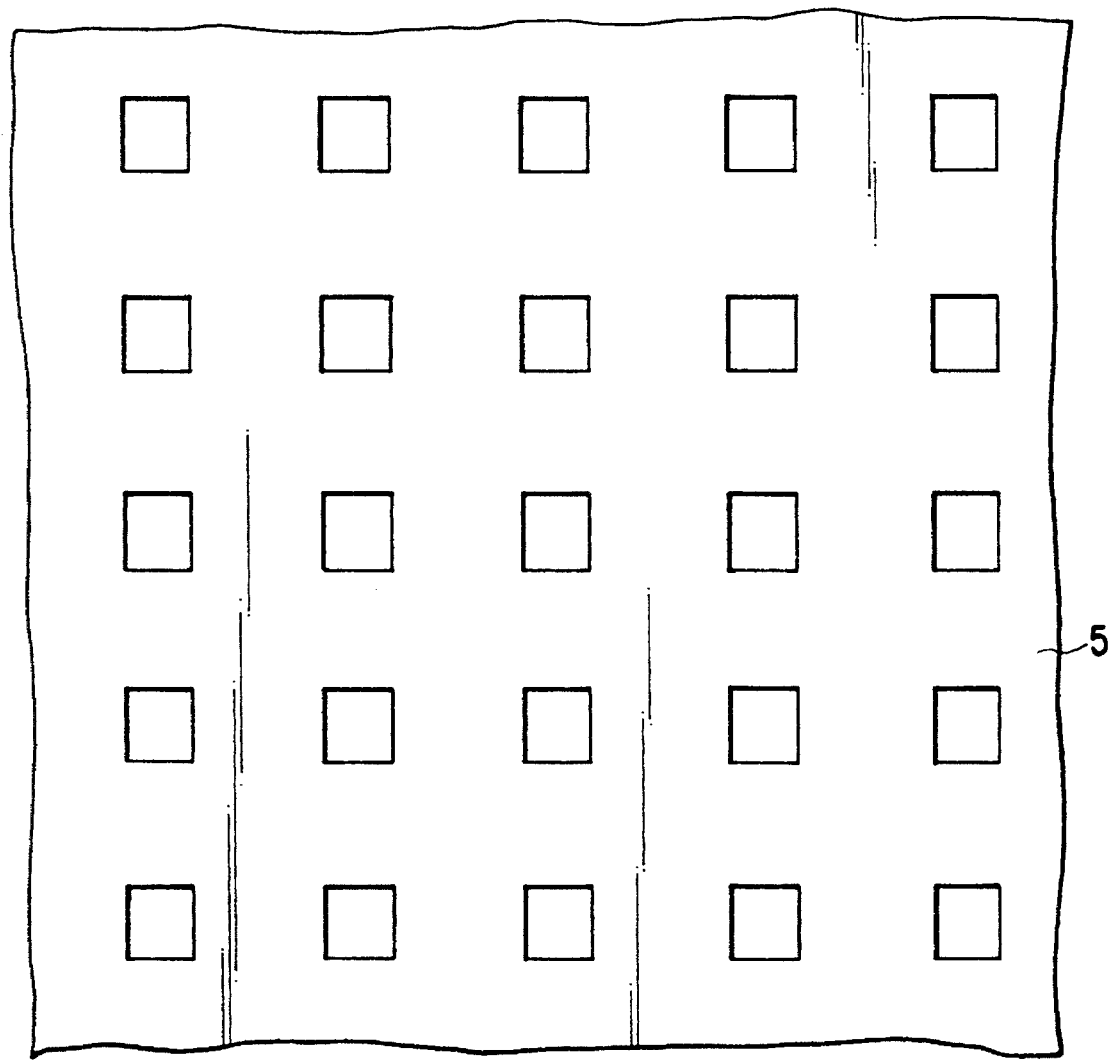
FIG. 6 is a plan view showing a pattern of a gate electrode formed over a substrate of MCT in FIG. 5.

FIG. 5 is a cross-sectional view showing an MCT according to a first embodiment of the present invention. FIG. 6 is a plan view showing a pattern of polysilicon gates formed over the substrate of MCT in FIG. 5. FIG. 7 is a plan view showing diffusion layers formed in the substrate surface portion of MCT in FIG. 5.

The arrangement of the MCT as shown in FIGS. 5 to 7 will be explained below.

A P type source region 1 is formed in a grid mesh-like pattern on a one-side surface portion of an N⁻ type semiconductor substrate. P type base regions 3 or P⁻ type base regions 20 are formed on the one-side surface portion of the N⁻ type semiconductor substrate 2 such that each is situated between the P type source region 1. N type emitter regions 4 are each formed in the P type base region 3 and an N type emitter region 21 is formed in the P⁻ type base region 20.

A polysilicon gate electrode 5 is formed over the N⁻ type semiconductor substrate 2 with a gate insulating film 6 therebetween. The polysilicon gate electrode 5 is formed in a grid mesh-like pattern and covers at least the P type source regions 1, N⁻ type semiconductor substrate 2, P type base region 3 and P⁻ type base region 20.

An insulating film 7 covers the polysilicon gate electrode 5. A cathode electrode 8 is formed over the N⁻ type semiconductor substrate 2 and connected to the P type source region 1, N type emitter regions 4, 21 and P⁻ type base region 20.

An N⁺ buffer layer 9 is formed on an other-side surface of an N⁻ type semiconductor substrate 2 and a P⁺ type emitter layer 10 is formed on the N⁺ buffer layer 9. The N⁺ buffer layer 9 serves to suppress the injection of holes from the P⁺ type emitter layer 10. An anode electrode 11 is formed on the other-side surface of the P⁺ emitter layer 10.

In the above-mentioned arrangement of the MCT, one or more cells α, α . . . including the P type base region 3 and at least one cell β including the P⁻ type base region 20 constitute one unit. In the present embodiment, one unit constitutes eight cells α and one cell β. The respective cell has a square contour as viewed from above the N⁻ type semiconductor substrate 2. The single cell β is surrounded with the eight cells α.

Figure 8:
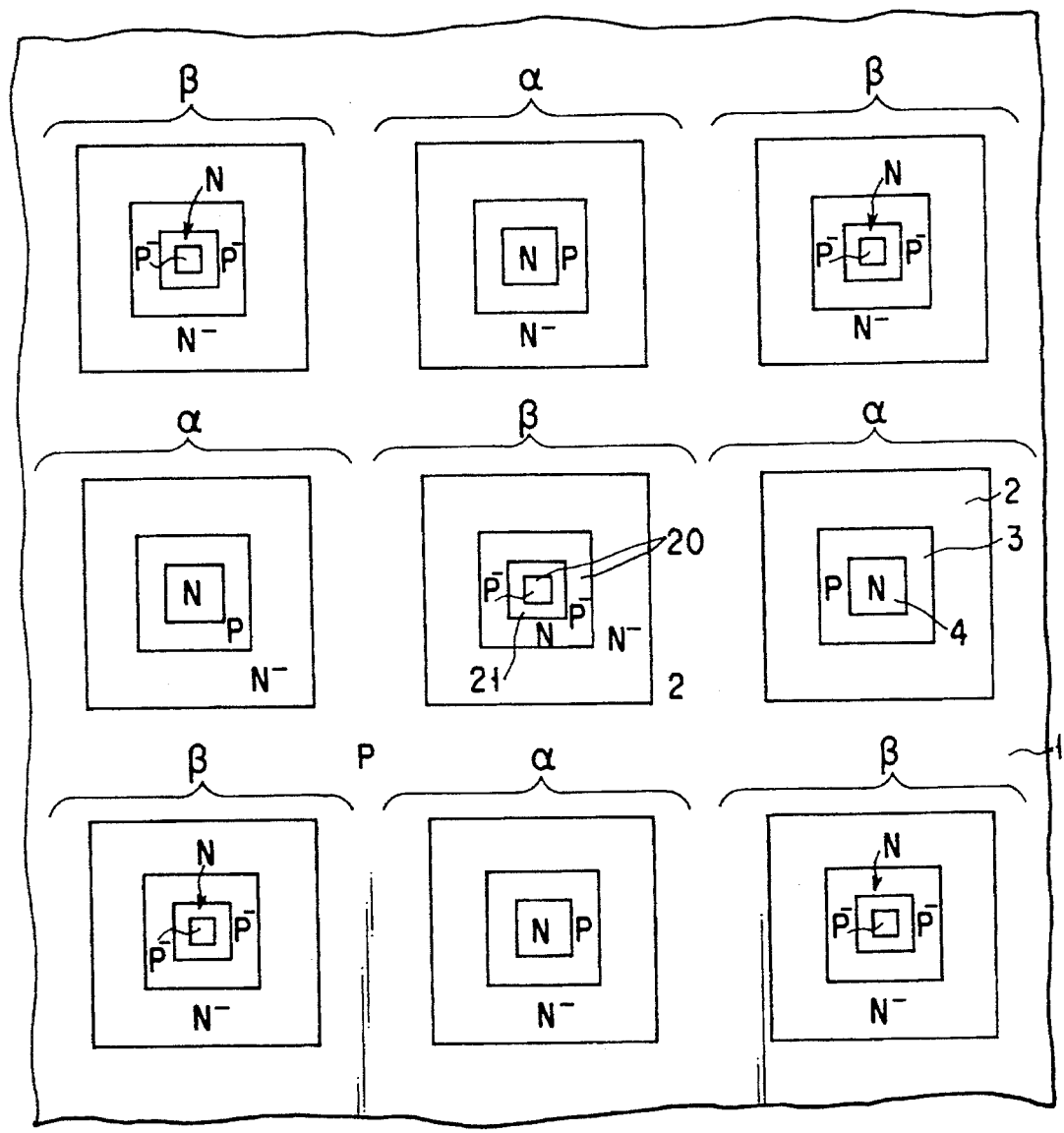
FIG. 8 shows diffusion layers formed in the surface portion of the substrate in MCT in FIG. 5.

The arrangement of the cell array is not restricted to that of the present embodiment. As shown in FIG. 8, for example, such cells β can also be arranged in a staggered array relative to the cells α. The cells β can also be arranged, in any proper array, relative to those cells α.

The arrangement of the cells α, α . . . including the P type base region 3 is the same as that of the conventional ones. The arrangement of the cell β including the P⁻ type base region 20 is suitable for the improvement of the turn-on characteristic of MCT. The cell β acts as a switch at the turn-on time. The cell β has the P⁻ type base region 20 lower in impurity concentration than the P type base region 3. An N type emitter region 21 has a frame-like configuration as viewed from above the N⁻ type semiconductor substrate 2, noting that the contour of the N type emitter region 21 is not restricted to the frame-like one. The cathode electrode 8 is in contact with both the P⁻ type base region 20 and N type emitter region 21.

In this way, the MCT of the present invention is of such a type that, of a plurality of cells, one or more cells are a cell β or cells β for improving the turn-on characteristic and others are cells a which, in order to improve the turn-off characteristic, have the highest possible impurity concentration in the P type base region 3.

The utilization of the MCT of the above-mentioned arrangement enables the following advantages to be obtained.

It is possible to improve the turn-off characteristic of the MCT.

That is, the impurity concentration of the P type base region 3 in the cell a is set at the height possible level and it is possible to lower the resistance of a hole discharge path of P type region 3→P channel inversion layer→P type source region 1 as created at the turn-off time.

Further, the P⁻ type base region 20 and N type emitter region 21 in the cell β are short-circuited and, at the turn-off time, holes are readily discharged from the P⁻ type base region into the cathode electrode 8.

It is also possible to improve the turning-on characteristic of the MCT.

That is, the impurity concentration of the P⁻ type base region 20 in the cell β is set to be lower than that of the P type base region 3 in the cell α. At the turn-on time of the MCT, therefore, the N channel inversion layer is liable to be formed at the P⁻ type base region 20 and electrons are rapidly injected from the N type emitter regions 4, 21 into the N⁻ type base region (substrate) 2.

By so doing, the MCT of the present invention can improve the turn-off characteristic, without degenerating the turn-off characteristic, and hence improve a trade-off between the turn-on characteristic and the turn-off characteristic.

Figure 9:
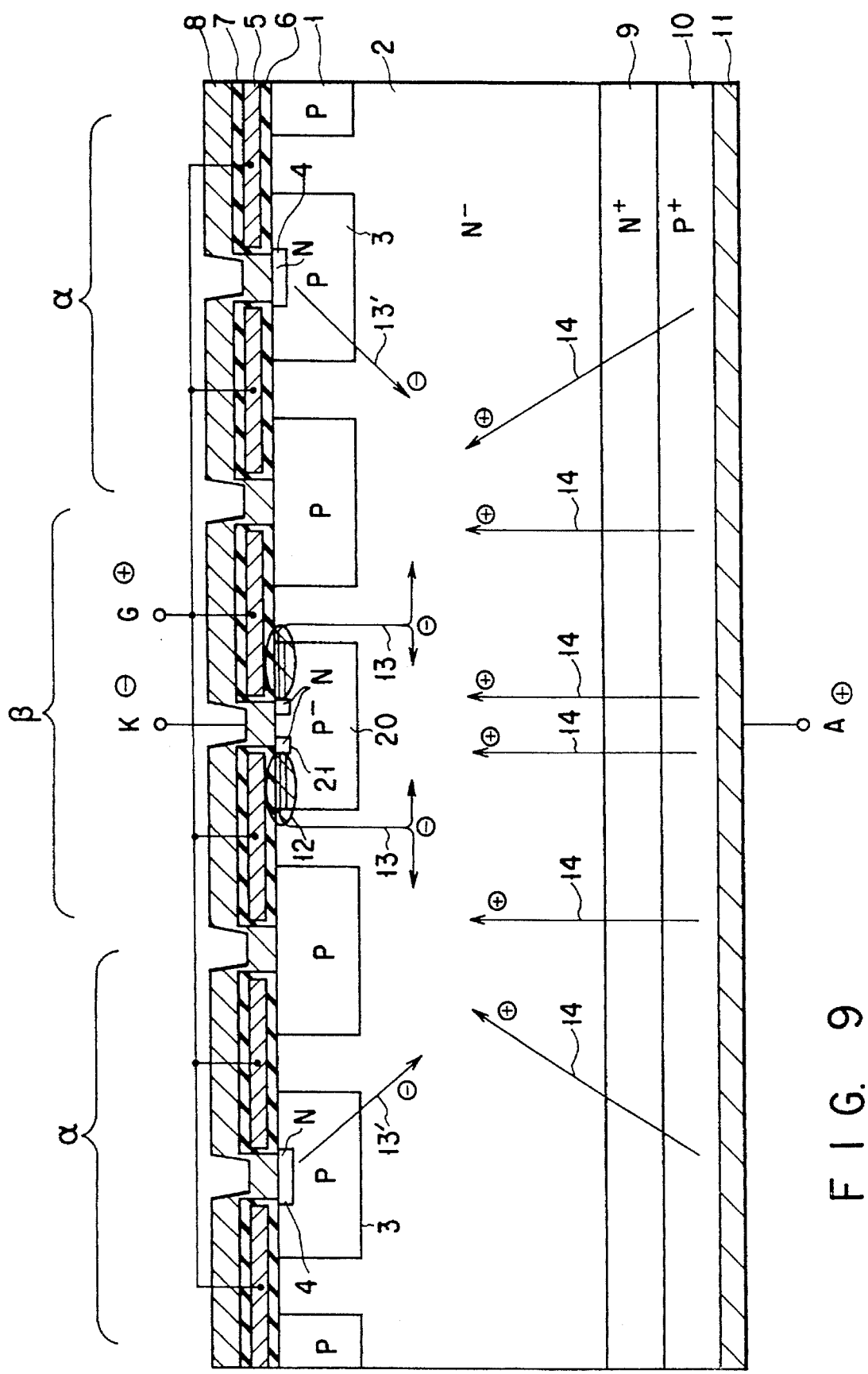
Figure 10:
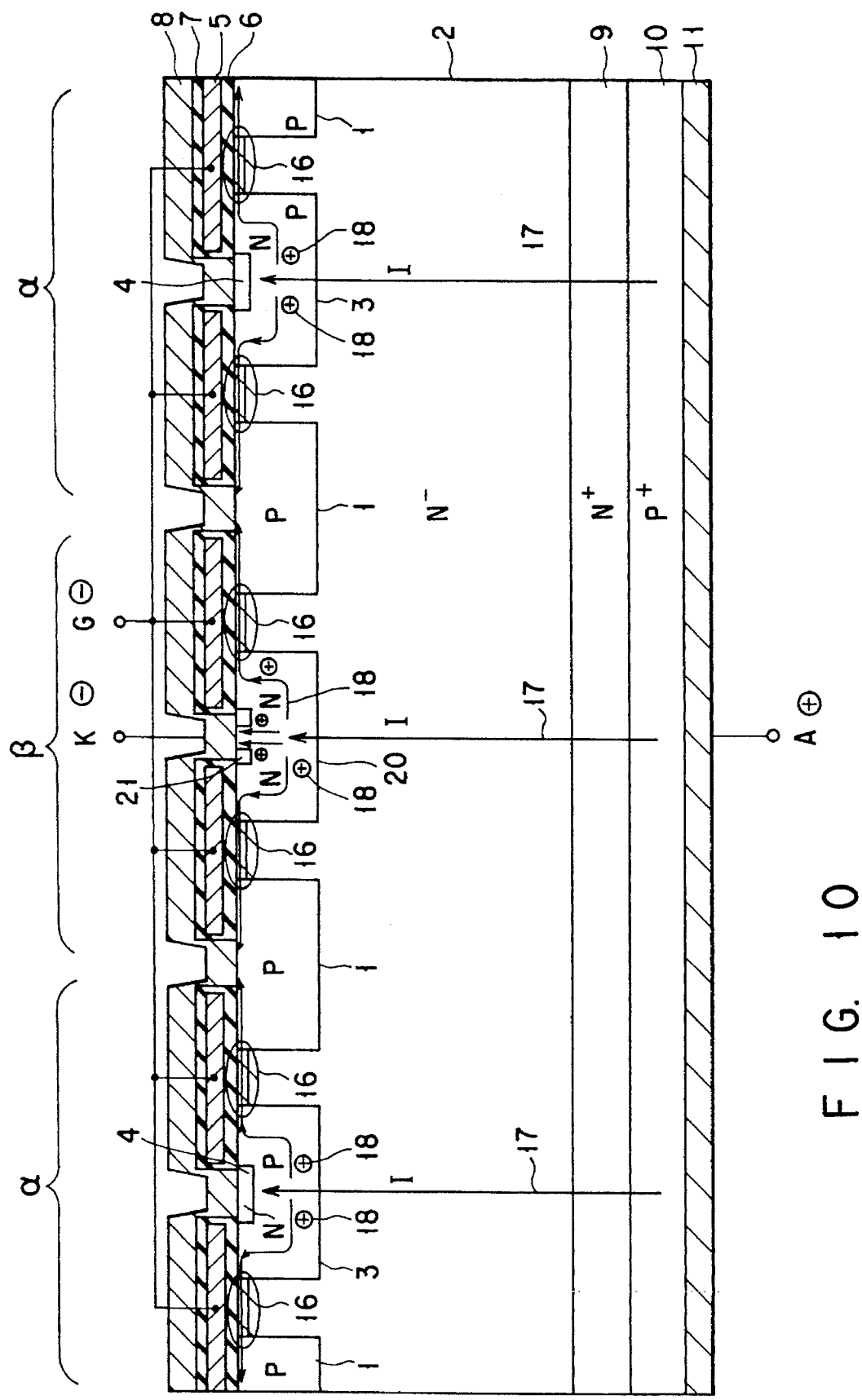
FIG. 10 is a view showing an operation when MCT in FIG. 5 is turned off.

FIGS. 9 and 10 show an operation (turn-on/turn-off) principle for the MCT in FIGS. 5 to 7.

Referring to FIG. 9, the operation of the MCT at the turn-on time will be explained below.

When the gate G is biased positive with the anode A biased positive and the cathode K biased negative, an N channel inversion layer 12 is immediately created at the surface portion of the P⁻ type base region 20 in the cell β for improving the turn-on characteristic, so that electrons 13 are injected from the N type emitter region 21 into the N⁻ type base region (substrate) 13. As a result, holes 14 are induced in the P+ type emitter layer 10 and injected into the N⁻ type base region 2. A conductivity modulation occurs at the N⁻ type base region 2 and electrons 13' are injected from the N type emitter region 4 of the respective cell a via the P type base region 3 into the N⁻ type base region 2, thus resulting in the MCT being turned on.

Referring to FIG. 10, the operation of the MCT at the turn-off time will be explained below.

When the gate G is biased negative with respect to the cathode K in such a state that a main current 17 flows with the anode A biased positive and cathode K biased negative, then the N channel inversion layer created at the turn-on time disappears.

A P channel inversion layer 16 is formed in the surface portion of the N⁻ type base region 2 between the P type base region 3 and the P type source region 1 in the respective cells α, α . . . As a result, the P type base region 3, P type source region 1 and cathode electrode 8 are short-circuited, thus allowing holes 18 in the main current 17 to be discharged out of the cathode electrode 8. At the same time, the P⁻ type base region 20 and N type emitter region 21 in the cell β are short-circuited and holes 18 are discharged from the P⁻ type base region 20 directly into the cathode electrode 8.

Since, by this operation, the injection of electrons from the N type emitter region 4 into the N⁻ type base region 2 is stopped, the main current 17 ceases to flow. As a result, the MCT is turned off.

FIGS. 11 to 22 are views showing one process for manufacturing the MCT as shown in FIGS. 5 to 7.

Figure 11:
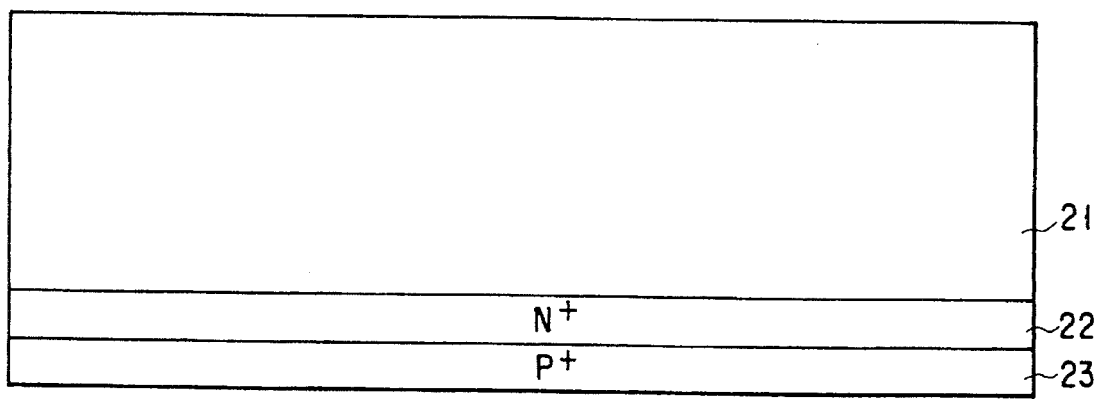
FIG. 11 is a view showing an arrangement at a step of manufacturing MCT in FIG. 5.

As shown in FIG. 11, phosphorus (P) or arsenic (As) is, for example, diffused, as an N type impurity ion, into an N⁻ type semiconductor substrate 21 to provide an N⁺ type buffer layer 22 in a one-side major surface portion of the N⁻ type semiconductor substrate 21. By a diffusion method for example, boron (B) is diffused, as a P type impurity ion, into the N⁺ type buffer layer 22 to provide a P⁺ type emitter layer 23.

Figure 12:
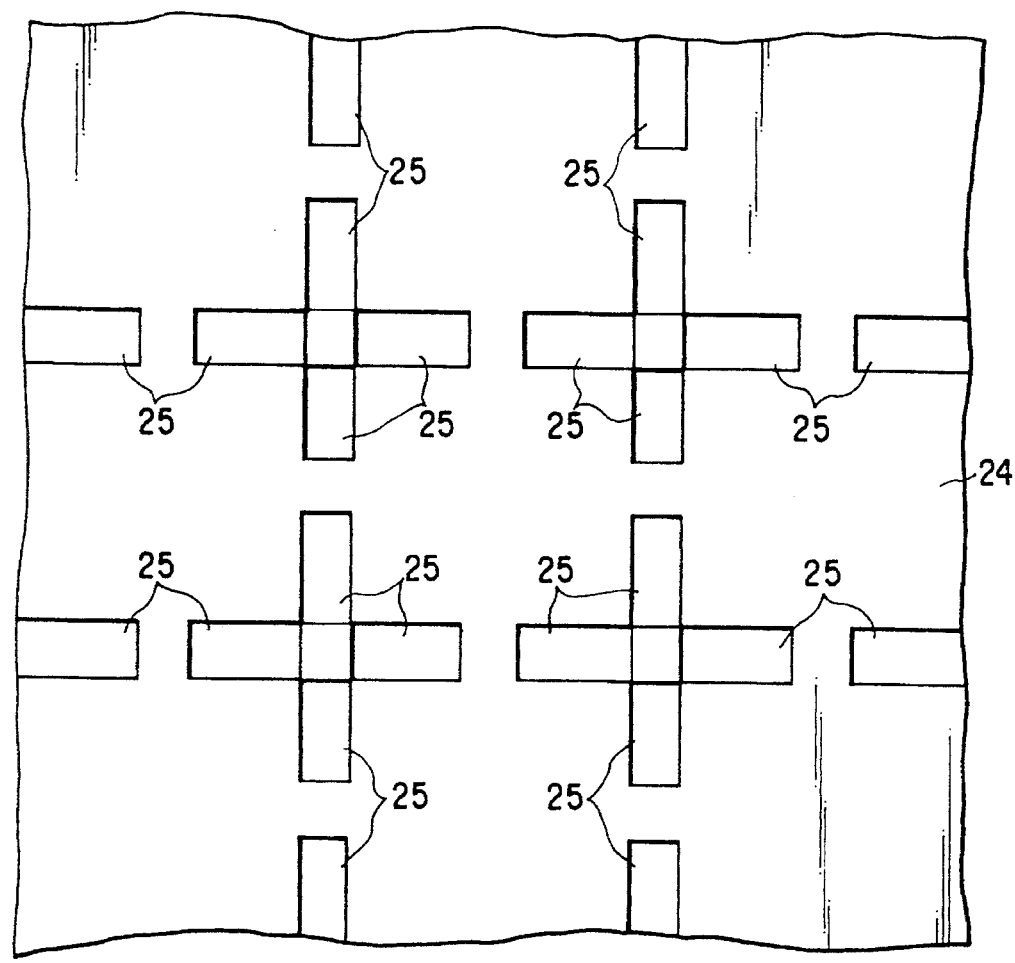
FIG. 12 is another view showing an arrangement at a step of manufacturing MCT in FIG. 5.

As shown in FIG. 12, an oxide film and resist film 24 are formed on an other major surface of the N⁻ type semiconductor substrate 21. Openings 25 are provided in the resist film 24 at predetermined places. By an ion implantation method for example, a P type impurity ion, for example, a boron (B) ion, is implanted, at a concentration of about $1 \times 10^{15}$ cm$^{-2}$, in the N⁻ type semiconductor substrate 21 with the resist film 24 as a mask.

Figure 13:
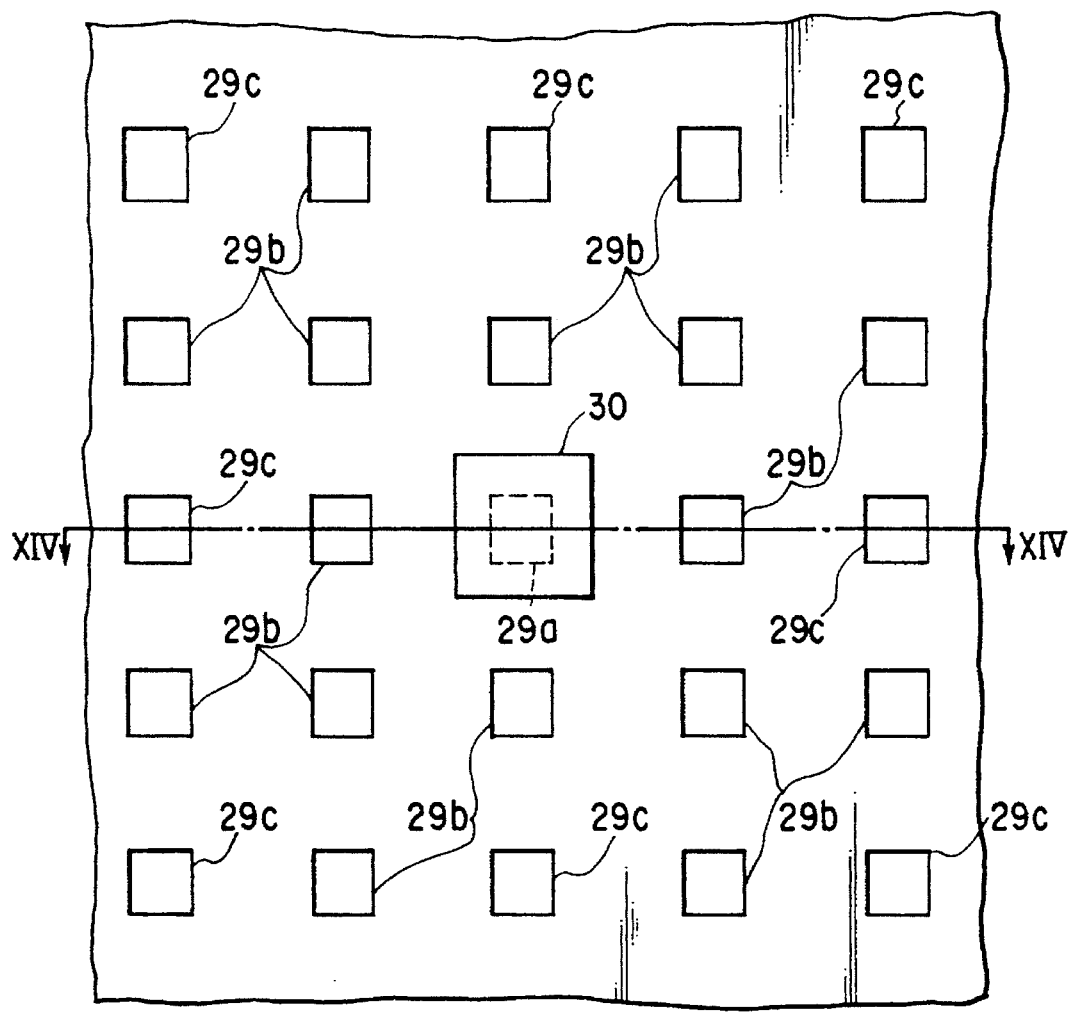
FIG. 13 is another view showing an arrangement at a step of manufacturing MCT in FIG. 5.
Figure 14:
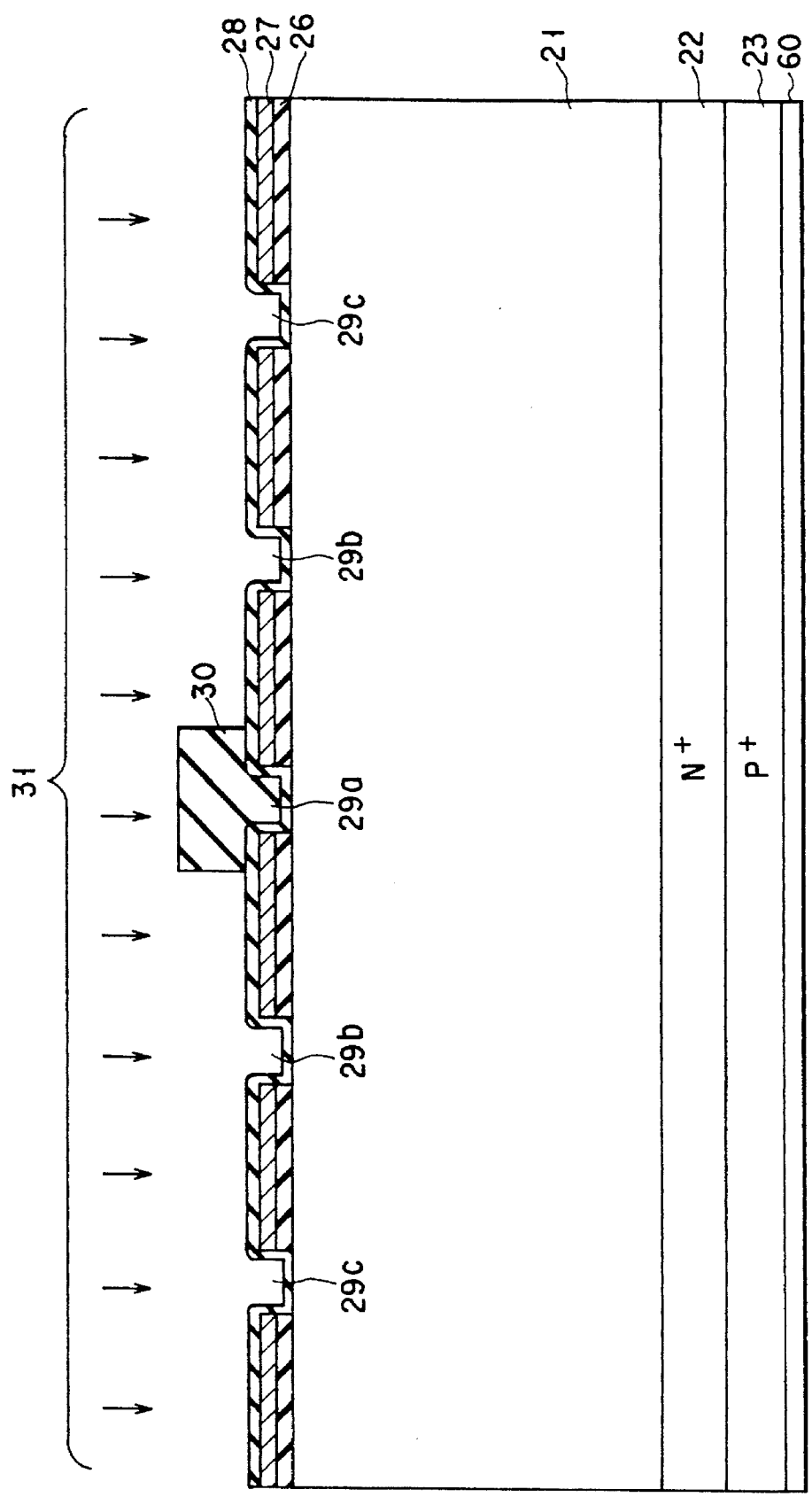
FIG. 14 is another view showing an arrangement at a step of manufacturing MCT in FIG. 5.

As shown in FIGS. 13 and 14, after the removal of the oxide film and resist film 24, a gate oxide film 26 is formed on the other-side surface of the N⁻ type semiconductor substrate 21. A polysilicon film is formed on the gate oxide film 26, for example, by a CVD method. With the polysilicon film and gate oxide film 26 patterned, a polysilicon gate electrode 27 is formed in a grid mesh-like pattern on the resultant semiconductor structure and an oxide film 28 is formed on the polysilicon gate electrode 27.

A resist film 30 is formed on the oxide film 28. With the resist film 30 patterned, the resist film 30 is left on only an opening 29a of the corresponding polysilicon gate electrode 27. With the polysilicon gate electrode 27 and resist film 30 as a mask, a P type impurity ion, for example, a boron (B) iron, is implanted, at a concentration of about $1\times10^{15}$ cm⁻², into the N⁻ type semiconductor substrate 21 with the use of, for example, the ion implantation method.

Figure 16:
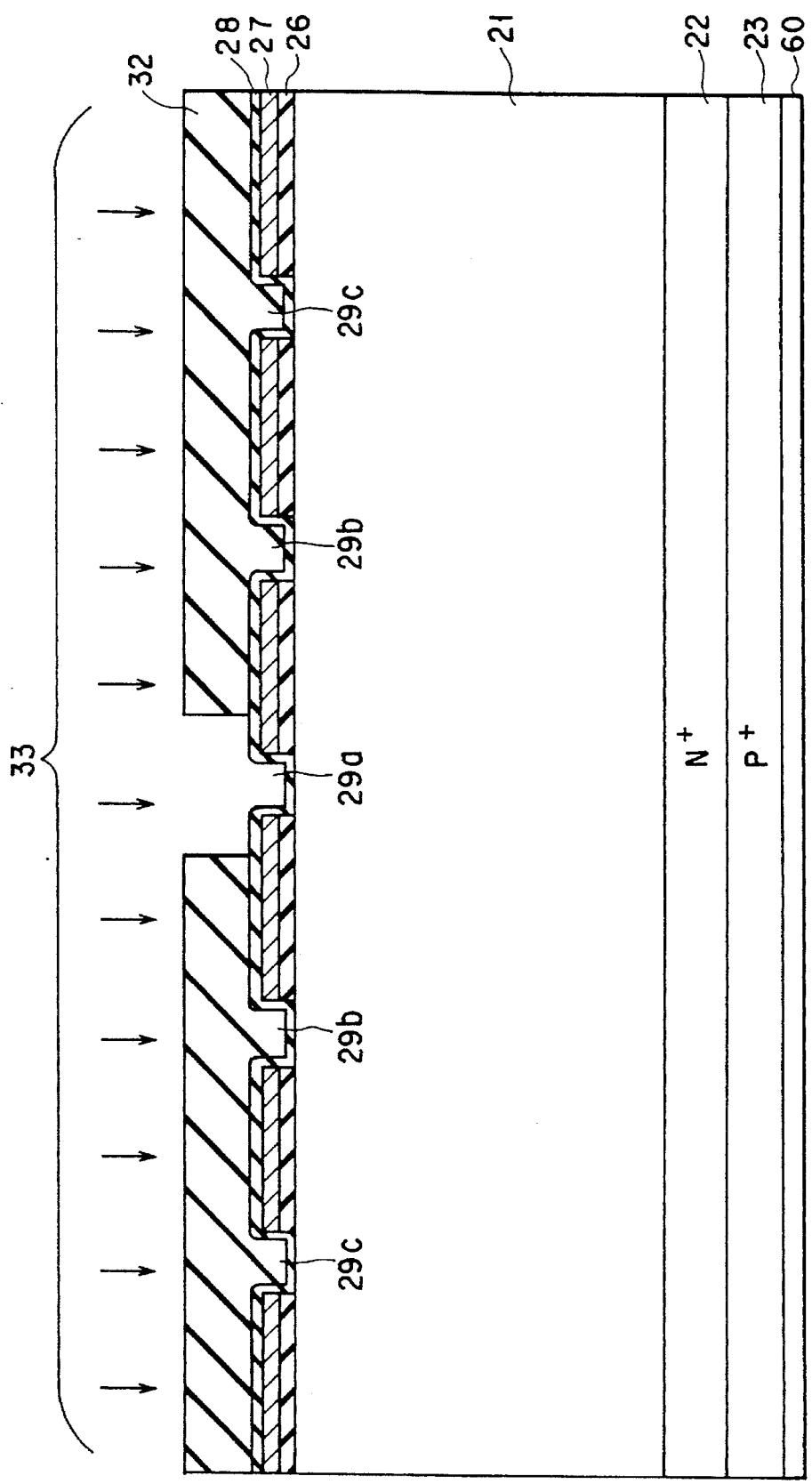
FIG. 16 is another view showing an arrangement at a step of manufacturing MCT in FIG. 5.

Then, as shown in FIGS. 15 and 16, after the removal of the resist film 30 a new resist film 32 is formed on the resultant semiconductor structure. With the resist film 32 patterned, the resist film 32 is left in openings 29b and 29c in the polysilicon gate electrode 27.

with the polysilicon gate electrode 27 and resist film 32 as a mask, the P type impurity, for example, boron (B) 33, is ion implanted, at a concentration of about $3\times10^{14}$ cm⁻², into the N⁻ type semiconductor substrate 21 by the ion implantation method for example.

Figure 17:
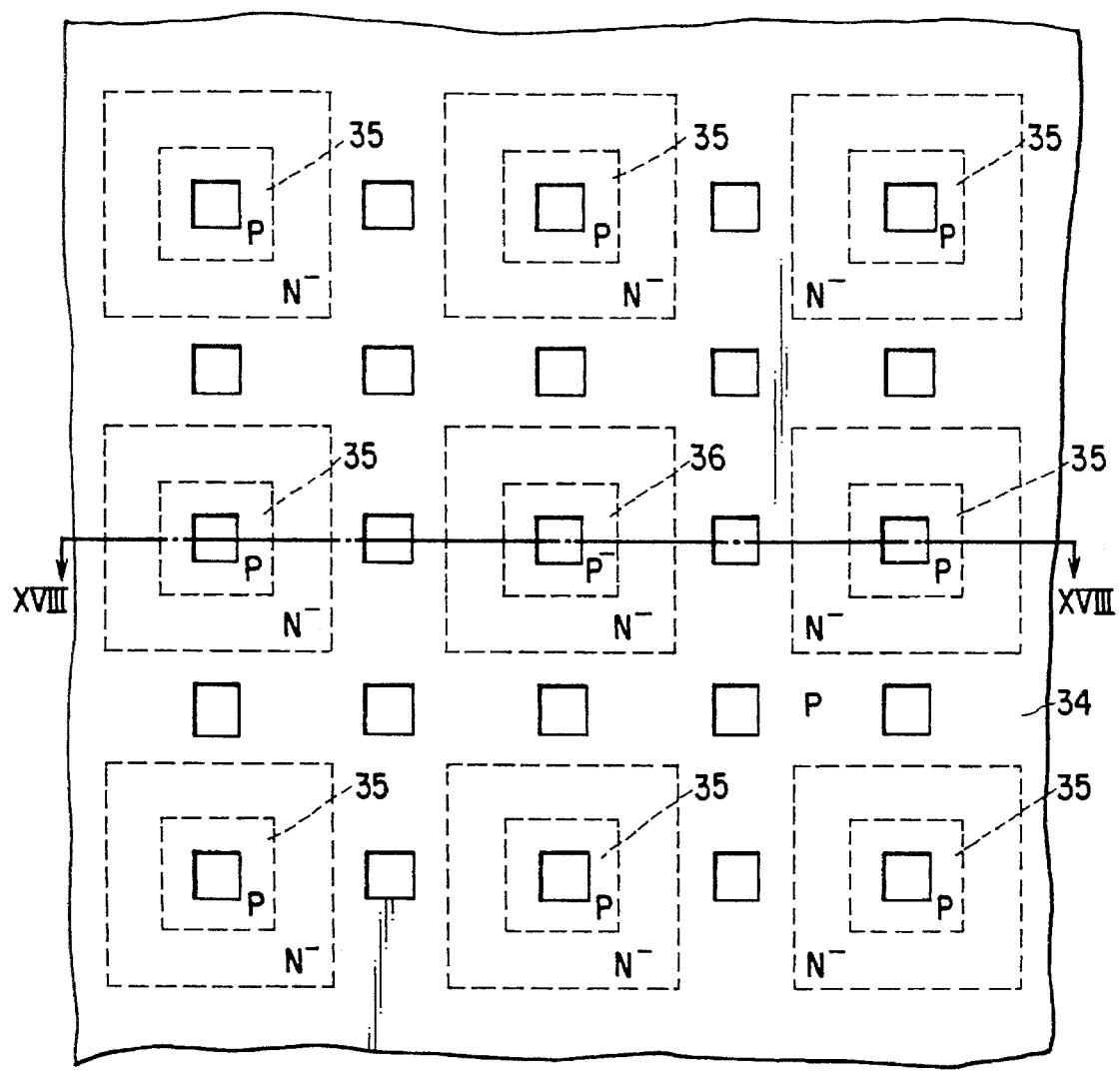
FIG. 17 is another view showing an arrangement at a step of manufacturing MCT in FIG. 5.
Figure 18:
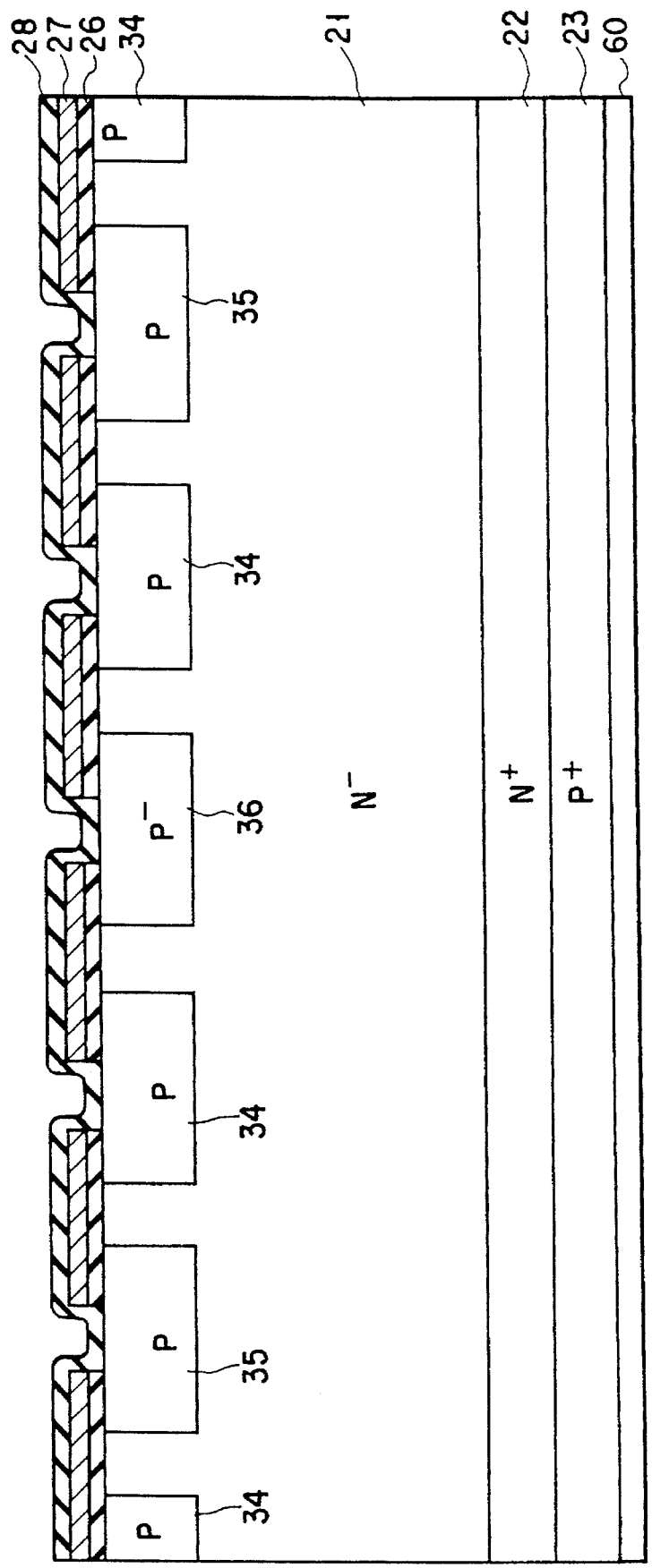
FIG. 18 is another view showing an arrangement at a step of manufacturing MCT in FIG. 5.

As shown in FIGS. 17 and 18, after the resist film 32 has been removed and the resultant semiconductor structure has been annealed, a P type source region 34 is provided in a grid mesh-like pattern in the surface portion of the N⁻ type semiconductor substrate 21 and a P type base region 35 and P⁻ type base region 36 are each formed in the surface portion of the N⁻ type semiconductor substrate 21 at a corresponding area between the P type source portions 34.

Figure 20:
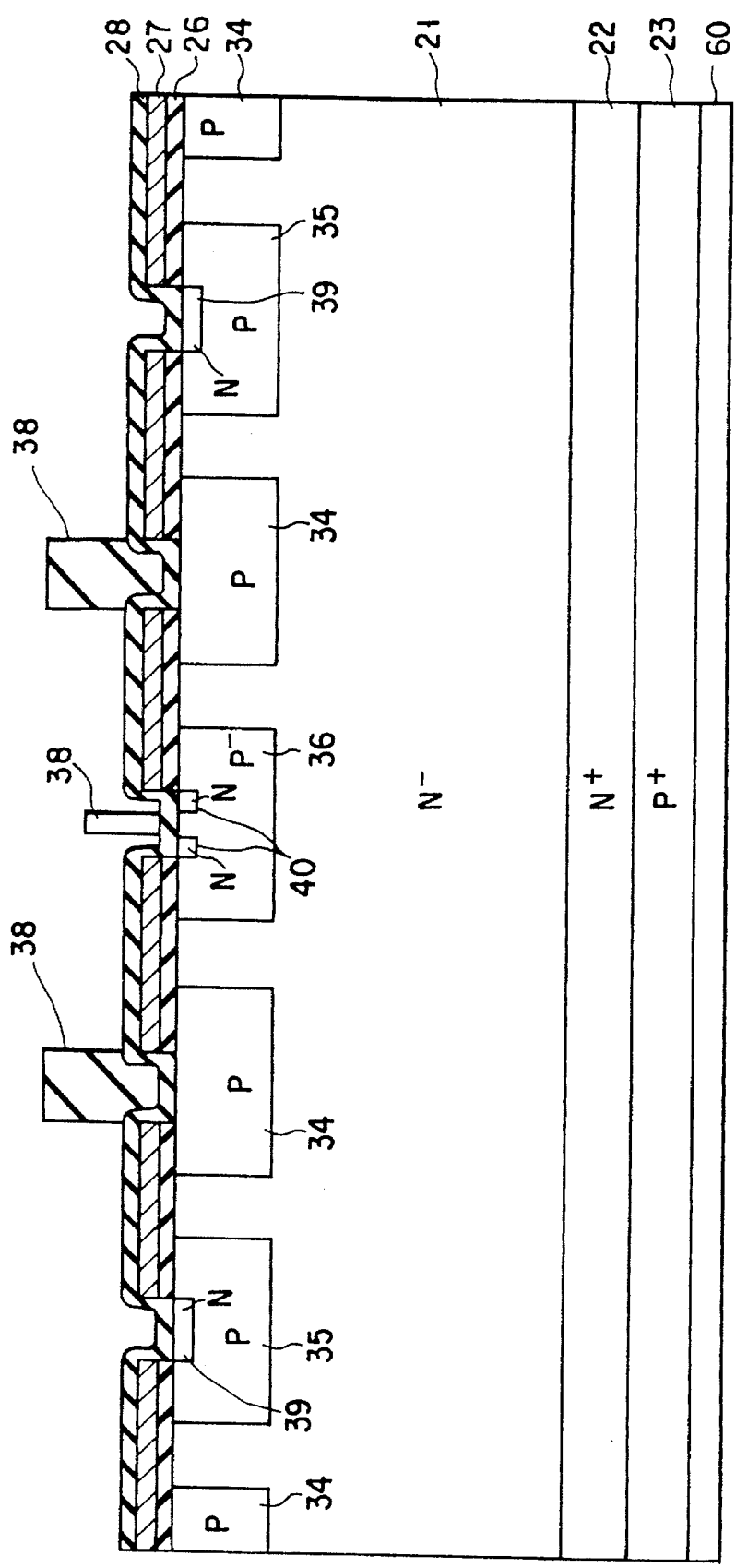
FIG. 20 is another view showing an arrangement at a step of manufacturing MCT in FIG. 5.

As shown in FIGS. 19 and 20, a resist film 38 is formed over the oxide film 28. The resist film 38 is patterned, leaving the resist films 38 over a portion of the opening 29a of the polysilicon gate electrode 27 and over the opening 29b.

By the ion implantation method for example, an N type impurity, such as phosphorus (P), is ion implanted in the N⁻ type semiconductor substrate 21, and by using the polysilicon gate electrode 27 and resist film 38 as a mask. After annealing has been effected, N type emitter regions 39 and 40 are created in the P type base region 35 and P⁻ type base region 36, respectively.

Figure 22:
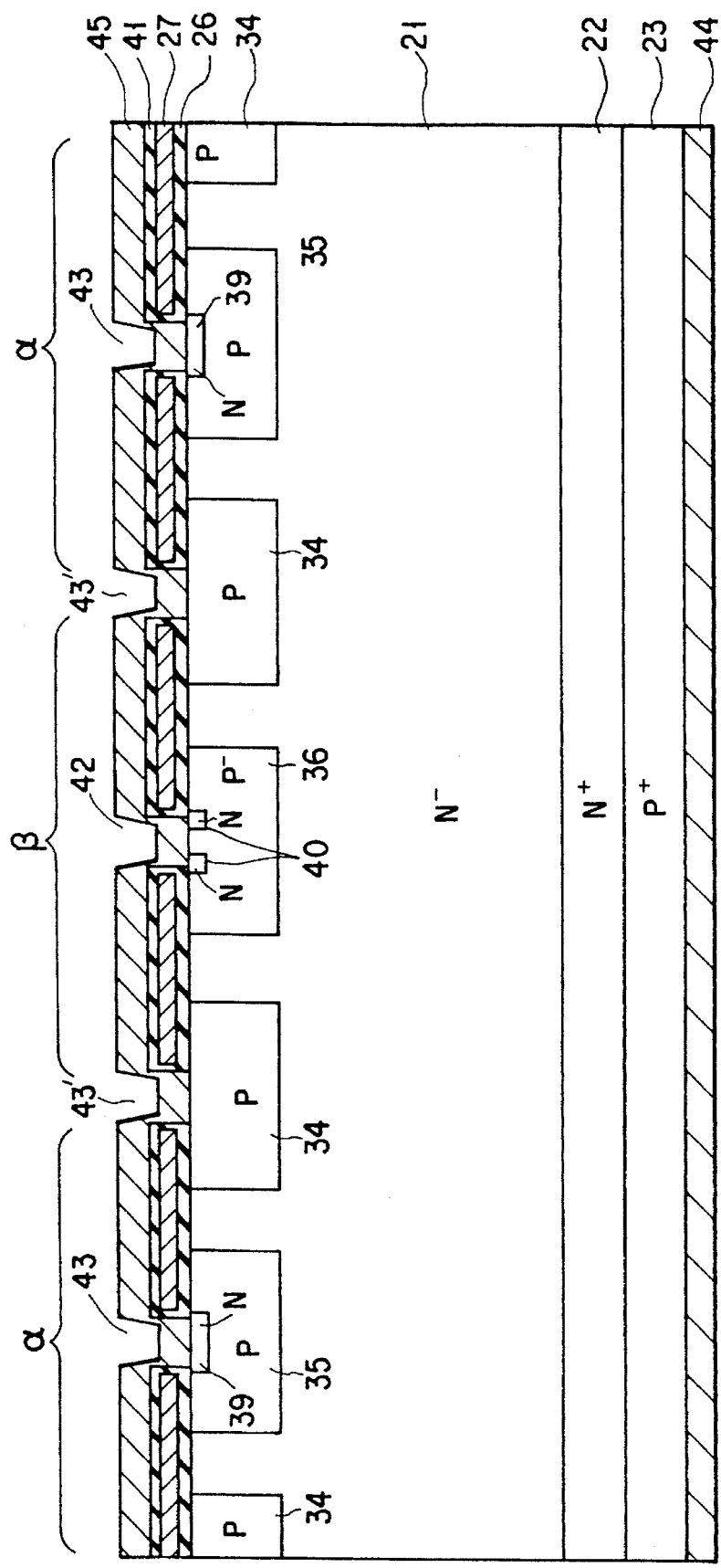
FIG. 22 is another view showing an arrangement at a step of manufacturing MCT in FIG. 5.

Then the oxide film 28 and resist film 38 are removed as shown in FIGS. 21 and 22. The oxide film 28 is partially etched, creating opening 42 leading to the P⁻ type base region 36 and the N type emitter region 40, openings 43 leading to the N type emitter regions 39, and openings 43' lending to the P type source regions 34.

After the oxide film 60 is removed, an anode electrode 44 is formed on the one major surface side of the resultant semiconductor substrate 21 and a cathode electrode 45 is formed on the other surface side of the resultant semiconductor structure. The cathode electrode 45 is connected via the opening 42 to the P⁻ type base region 36 and N type emitter region 40 and via the opening 43 to the P type source section 34 and N type emitter region 39.

FIGS. 23 shows another method for manufacturing the MCT as in FIGS. 5 to 7.

As shown in FIG. 23, an N⁺ type buffer layer 52 is formed, by the epitaxial growth method, on a one major surface side of a P⁺ type semiconductor substrate 51. By the epitaxial growth method, an N⁻ type epitaxial layer 53 is formed on the N⁺ type buffer layer 52. The MCT as shown in FIGS. 5 to 7 is completed by subsequently using the same method as in FIGS. 12 to 22.

Figure 24:
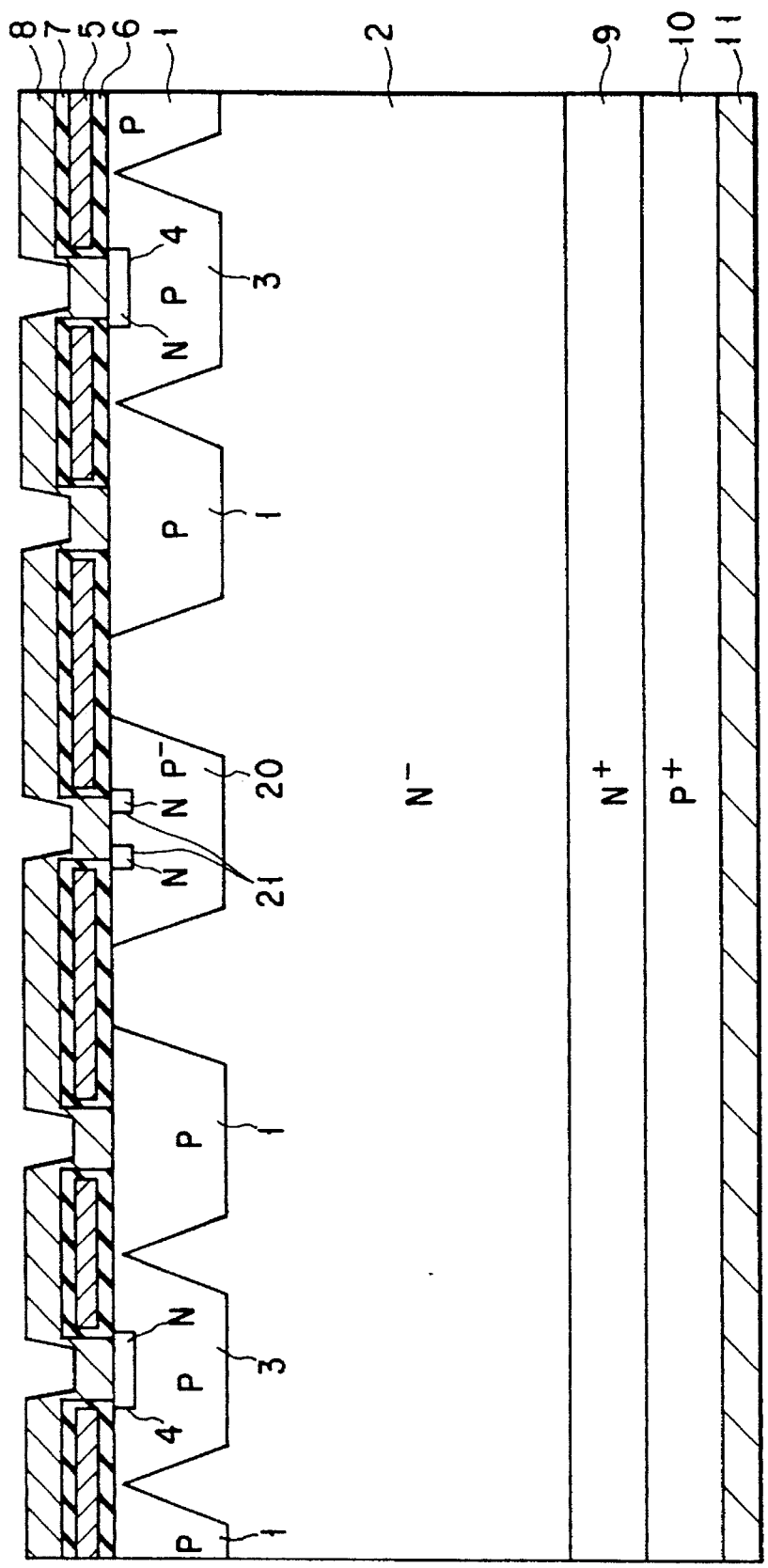
FIG. 24 is a cross-sectional view showing an MCT according to a second embodiment of the present invention.
Figure 26:
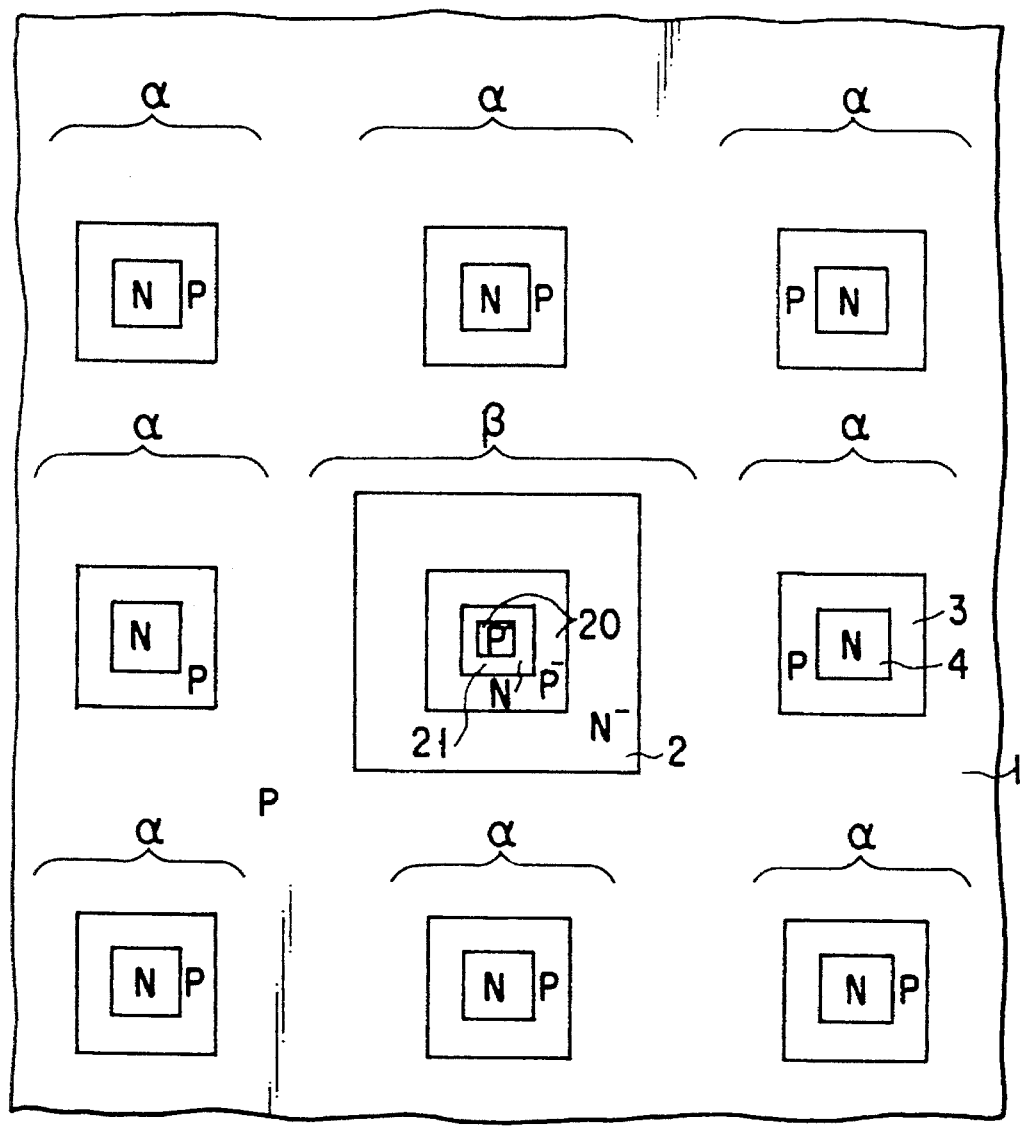
FIG. 26 is a plan view showing diffusion layers formed in the surface portion of MCT in FIG. 24.

FIG. 24 is a cross-sectional view showing an MCT according to a second embodiment of the present invention. FIG. 25 is a plan view showing a pattern of a polysilicon gate electrode formed over a substrate in the MCT shown in FIG. 24. FIG. 26 is a plan view showing diffusion layers formed in the surface portion of the substrate in the MCT shown in FIG. 24.

An arrangement of the MCT shown in FIGS. 24 to 26 will be explained below.

A P type source region 1 is formed in a grid mesh-like pattern in a one surface portion of an N⁻ type semiconductor substrate 2. A P type base region 3 or P⁻ type base region 20 is formed in the one surface portion of the N⁻ type semiconductor substrate 2 at an area between P type source portions.

The P type base region 3 is situated in a contacting relation to the P type source region 1. An N type emitter region 4 is formed in the P type base region 3. An N type emitter region 21 is formed on the P⁻ type base region 20.

A polysilicon gate electrode 5 is created over the N⁻ type semiconductor substrate 2 with a gate insulating film 6 therebetween. The polysilicon gate electrode 5 is formed in a grid mesh-like pattern and covers at least the N⁻ type semiconductor substrate 2, P type base region 3 and P⁻ type base region 20.

The insulating film 7 is covered with the polysilicon gate electrode 5. A cathode electrode 8 is formed over the N⁻ type semiconductor substrate 2 and connected to the P type source section 1, N type emitter regions 4 and 21 and P⁻ type base region 20.

An N⁺ buffer layer 9 is formed on an other surface side of the N⁻ type semiconductor substrate 2. A P⁺ type emitter layer 10 is formed on the N⁺ type buffer layer 9. The N⁺ buffer layer 9 serves to suppress the injection of holes from the P⁺ type emitter layer 10 at a turn-off time. An anode electrode 11 is formed on the other surface of the P⁺ type emitter layer 10.

The above-mentioned MCT is different from the MCT shown in FIG. 5 in that the P type base region 3 and P type source section 1 are contacted with each other at the surface portion of the N⁻ type semiconductor substrate 2. That is, the MCT of the present embodiment is such that a P channel MOSFET created at the turn-off time is of a depletion type.

For such an MCT it is also possible to obtain the same advantages as those of the first embodiment. Further, the channel resistance of the P channel MOSFET created at the turn-off time is lowered, thus obtaining an added advantage of ensuring a readier turning-off effect.

The manufacturing process and operation principle for the MCT shown in FIGS. 24 to 26 are the same as those of the MCT shown in FIGS. 5 to 7.

Figure 27:
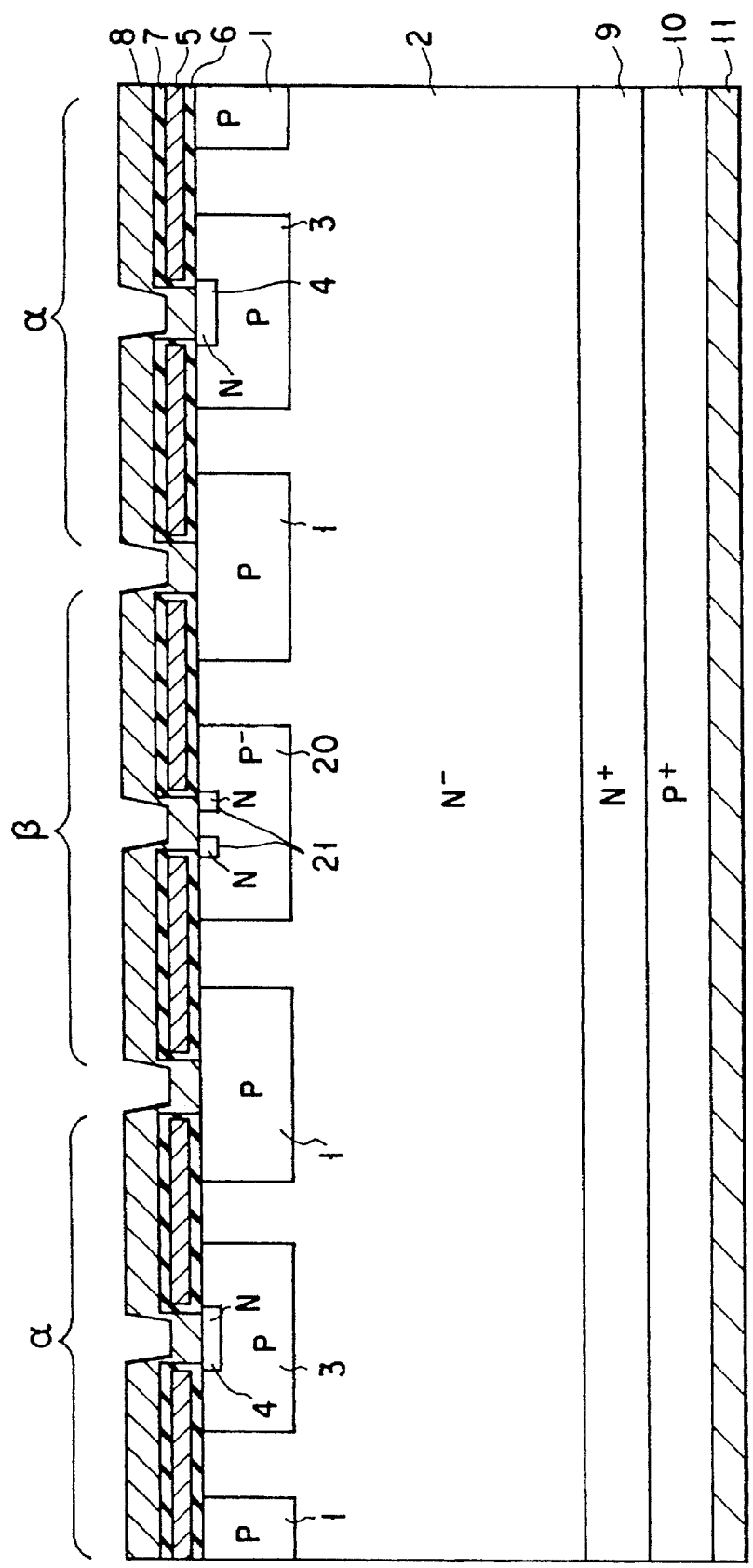
FIG. 27 is a cross-sectional view showing an MCT according to a third embodiment of the present invention.
Figure 28:
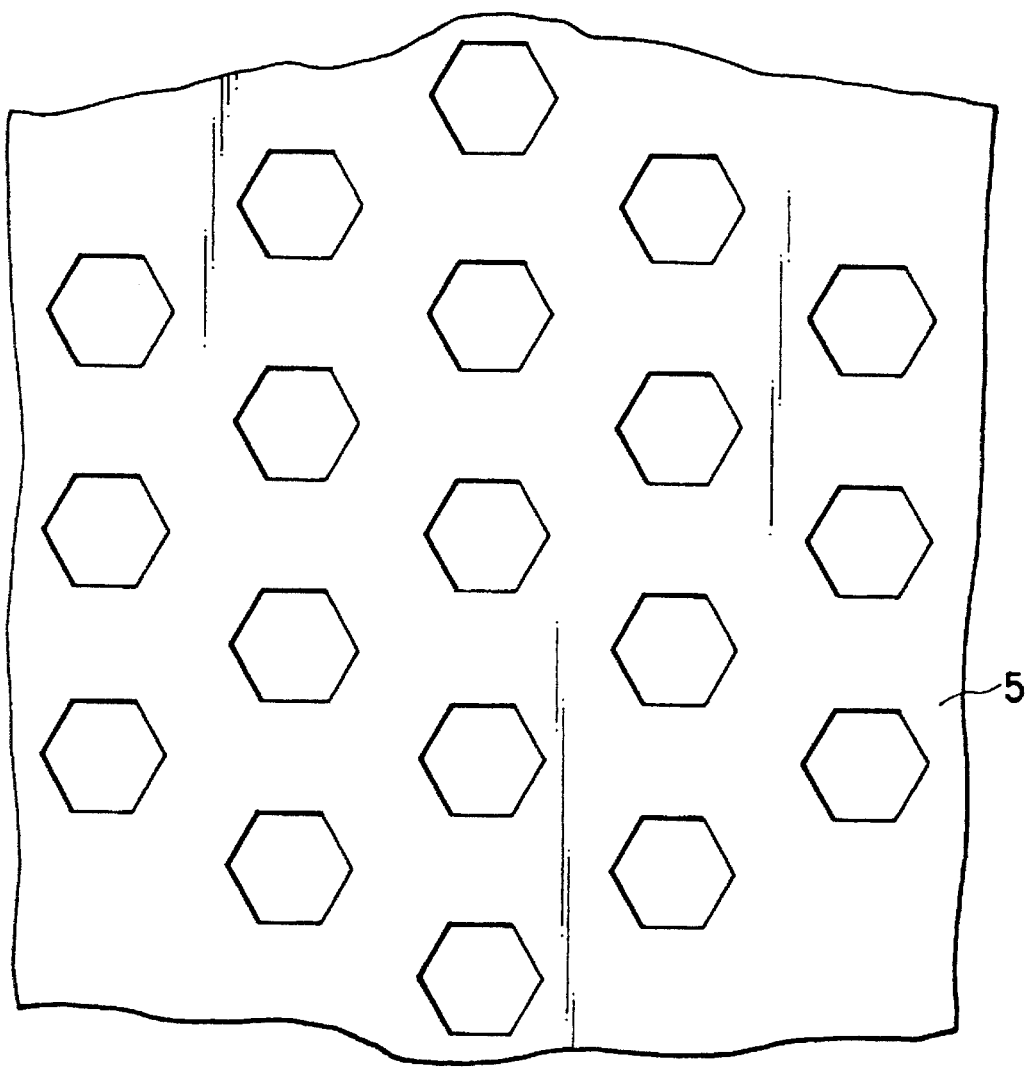
FIG. 28 is a plan view showing a pattern of a gate electrode formed over a substrate of MCT in FIG. 27.
Figure 29:
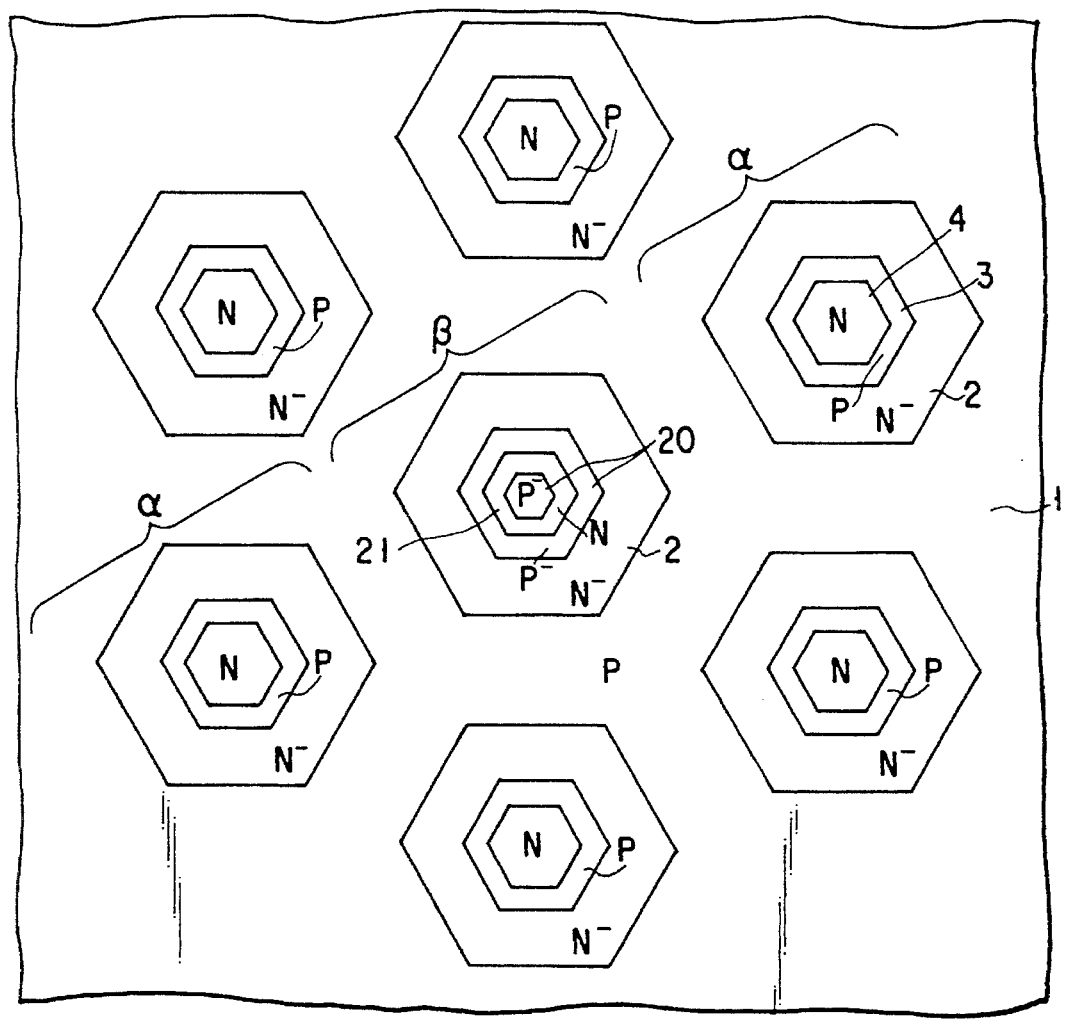
FIG. 29 is a plan view showing diffusion layers formed in the surface portion of the substrate of MCT in FIG. 27.

FIG. 27 is a cross-sectional view showing an MCT according to a third embodiment of the present invention. FIG. 28 is a plan view showing a pattern of a polysilicon gate electrode formed over a substrate of the MCT shown in FIG. 27. FIG. 29 is a plan view showing diffusion layers in the surface portion of the MCT shown in FIG. 27.

The arrangement of the MCT shown in FIGS. 27 to 29 will be explained below.

A P type source region 1 is formed in a hexagonal-mesh like pattern in a one-side surface portion of an N⁻ type semiconductor substrate 2. A P type base region 3 or P⁻ type base region 20 is formed in the one surface portion of the N⁻ type semiconductor substrate 2 at a respective hexagonal mesh area of the P type source region 1. An N type emitter region 4 is formed in the corresponding P type base region 3. An N type emitter region 21 is formed in the P⁻ type base region 20. The P type base region 3, N type emitter regions 4 and 21 and P⁻ type base region 20 have a hexagonal contour, each, as viewed from above the N⁻ type semiconductor substrate 2.

A polysilicon gate electrode 5 is formed over the N⁻ type semiconductor substrate 2 with a gate insulating film 6 therebetween. A polysilicon gate electrode 5 is formed in a hexagonal mesh-like pattern and covers at least the N⁻ type semiconductor substrate 2, P type base region 3 and P⁻ type base region 20.

An insulating film 7 covers the polysilicon gate electrode 5. A cathode electrode 8 is formed over the N⁻ type semiconductor substrate 2 and is connected to the P type source region 1, N type emitter regions 4 and 21 and P⁻ type base region 20.

An N⁺ buffer layer 9 is formed on the other surface side of the N⁻ type semiconductor substrate 2. A P⁺ type emitter layer 10 is formed on the N⁺ buffer layer 9. The N⁺ buffer layer 9 serves to suppress the injection of holes from the P⁺ type emitter layer 10. An anode electrode 11 is formed on the other surface of the P⁺ type emitter layer 10.

The above-mentioned MCT is different from the MCT shown in FIG. 5 in the outline of the diffusion layer formed in the surface portion of the N⁻ type semiconductor substrate 2 as well as the outline of the polysilicon gate electrode formed over the N⁻ type semiconductor substrate 2. That is, the MCT of the third embodiment is characterized in that it uses a hexagonal cell.

For the MCT above it is possible to obtain the same advantages as those gained from the first embodiment. The manufacturing process and operation principle for the MCT shown in FIGS. 27 to 29 are the same as those of the MCT shown in FIGS. 5 to 7.

Figure 30:
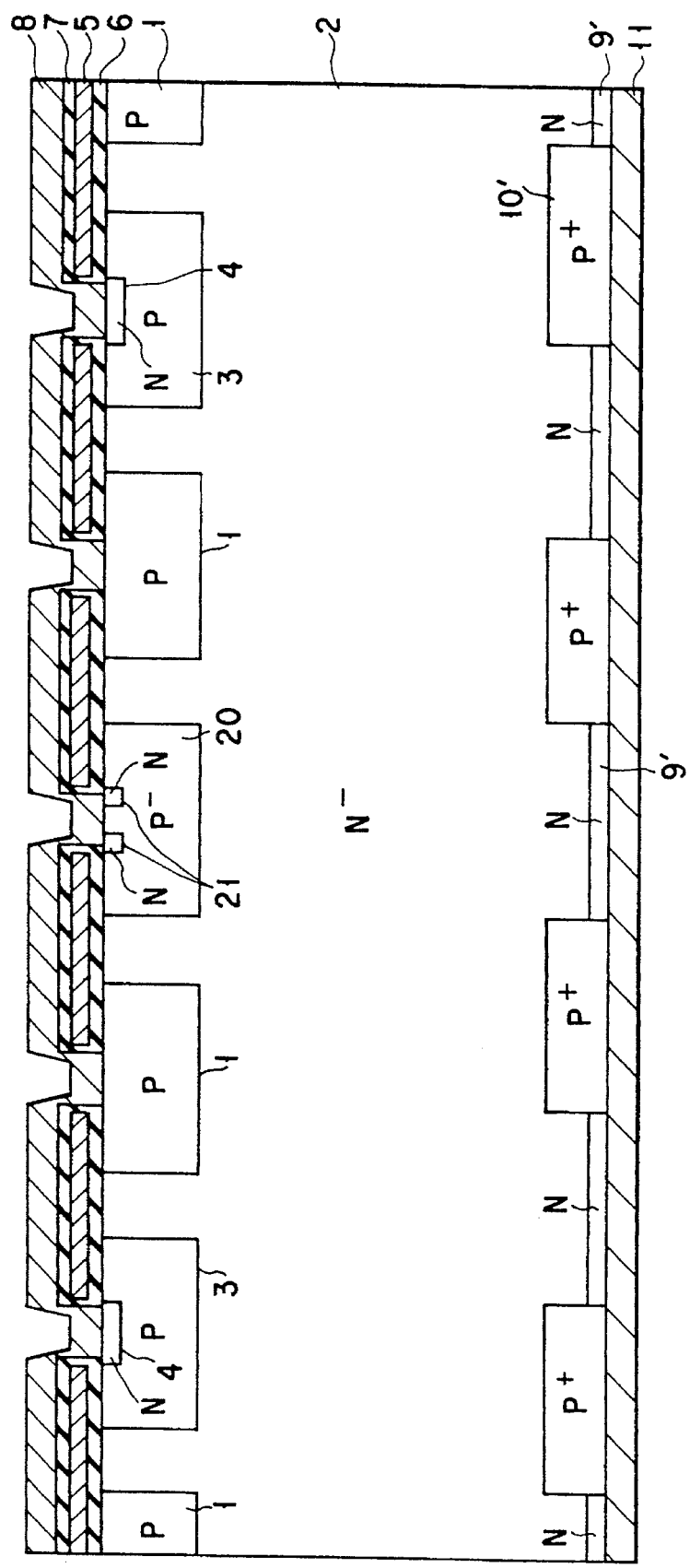
FIG. 30 is a cross-sectional view showing an MCT according to a fourth embodiment of the present invention.

FIG. 30 shows an MCT according to a fourth embodiment of the present invention.

The fourth embodiment is different from the embodiment shown in FIG. 5 in that an N type anode region 9' and P⁺ type anode region 10' are short-circuited by an anode electrode 11.

Even in the semiconductor device above, it is possible to obtain the same advantages as in the first embodiment.

Although the present invention has been explained in connection with the four embodiments above, it is not restricted thereto. The present invention can also be applied to, for example, a double gate type semiconductor device and to a semiconductor device of such a type that the N⁻ type semiconductor substrate is replaced by a P⁻ type substrate with a P channel MOSFET and N channel MOSFET used for an on channel and off channel, respectively.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a first semiconductor region of a first conductivity type;

at least one second semiconductor region of a second conductivity type formed in a first surface portion of the first semiconductor region;

at least one third semiconductor region of the second conductivity type formed in the first surface portion of the first semiconductor region and having an impurity concentration lower than that of the second semiconductor region;

a fourth semiconductor region of the second conductivity type formed in the first surface portion of the first semiconductor region and surrounding the at least one second semiconductor region and the at least one third semiconductor region, the first semiconductor region extending between the at least one second semiconductor region and the fourth semiconductor region and between the at least one third semiconductor region and the fourth semiconductor region;

a fifth semiconductor region of the first conductivity type formed in the at least one second semiconductor region;

a sixth semiconductor region, having a ring configuration, of the first conductivity type formed in the at least one third semiconductor region;

a seventh semiconductor region of the second conductivity type formed in a second surface portion of the first semiconductor region;

a gate electrode formed over the first semiconductor region, the at least one second semiconductor region, the at least one third semiconductor region and the fourth semiconductor region, each with an insulating film formed therebetween;

a first electrode provided in contact with the at least one third semiconductor region, the fourth semiconductor region, the fifth semiconductor region and the sixth semiconductor region, the first electrode making contact with an inside portion of the ring constituting the sixth semiconductor region and a portion of the third semiconductor region surrounded by the ring of the sixth semiconductor region; and a second electrode provided in contact with the seventh semiconductor region;

wherein the second semiconductor region, fourth semiconductor region and fifth semiconductor region form a first cell; and wherein the third semiconductor region, fourth semiconductor region and sixth semiconductor region form a second cell different from the first cell.

2. The semiconductor device according to claim 1, wherein the fourth semiconductor region has a mesh pattern in the first surface portion of the first semiconductor region and the gate electrode has a mesh pattern.

3. The semiconductor device according to claim 1, wherein the at least one second semiconductor region and the at least one third semiconductor region each have a square pattern in the first surface portion of the first semiconductor region.

4. The semiconductor device according to claim 1, wherein the at least one second semiconductor region and the at least one third semiconductor region each have a hexagonal shape in the first surface portion of the first semiconductor region.

5. The semiconductor device according to claim 1, wherein the at least one third semiconductor region is formed in a staggered relation to the at least one second semiconductor region.

6. The semiconductor device according to claim 1, wherein the sixth semiconductor region has a ring pattern in the first surface portion of the first semiconductor region.

7. The semiconductor device according to claim 1, further comprising a buffer layer of the first conductivity type formed between the first semiconductor region and the seventh semiconductor region.

8. The semiconductor device according to claim 1, wherein the second electrode is in contact with both the first semiconductor region and the seventh semiconductor region.

9. A semiconductor device comprising:

a first semiconductor region of a first conductivity type;

at least one second semiconductor region of a second conductivity type formed in a first surface portion of the first semiconductor region;

at least one third semiconductor region of the second conductivity type formed in the first surface portion of the first semiconductor region and having an impurity concentration lower than that of the second semiconductor region;

a fourth semiconductor region of the second conductivity type formed in the first surface portion of the first semiconductor region and surrounding the at least one second semiconductor region and the at least third semiconductor region, the at least one second semiconductor region and the fourth semiconductor region being contacted with each other in the first surface portion of the first semiconductor region and the first semiconductor region being situated between the at least third semiconductor region and the fourth semiconductor region;

a fifth semiconductor region of the first conductivity type formed in the at least one second semiconductor region;

a sixth semiconductor region, having a ring configuration, of the first conductivity type formed in the at least one third semiconductor region;

a seventh semiconductor region of the second conductivity type formed in a second surface portion of the first semiconductor region;

a gate electrode formed over the first semiconductor region, the at least one second semiconductor region, the at least one third semiconductor region and the fourth semiconductor region, each with an insulating film formed therebetween;

a first electrode provided in contact with the at least one third semiconductor region, the fourth semiconductor region, the fifth semiconductor region and the sixth semiconductor region, the first electrode making contact with an inside portion of the ring constituting the sixth semiconductor region and a portion of the third semiconductor region surrounded by the ring of the sixth semiconductor region; and a second electrode provided in contact with the seventh semiconductor region;

wherein the second semiconductor region, fourth semiconductor region and fifth semiconductor region form a first cell; and wherein the third semiconductor region, fourth semiconductor region and sixth semiconductor region form a second cell different from the first cell.

10. The semiconductor device according to claim 9, wherein the fourth semiconductor region has a mesh pattern in the first surface portion of the first semiconductor region and the gate electrode has a mesh pattern.

11. The semiconductor device according to claim 9, wherein the at least one second semiconductor region and the at least one third semiconductor region each have a square pattern in the first surface portion of the first semiconductor region.

12. The semiconductor device according to claim 9, wherein the at least one second semiconductor region and the at least one third semiconductor region each have a hexagonal shape in the first surface portion of the first semiconductor region.

13. The semiconductor device according to claim 9, wherein the at least one third semiconductor region is formed in a staggered relation to the at least one second semiconductor region.

14. The semiconductor device according to claim 9, wherein the sixth semiconductor region has a ring pattern in the first surface portion of the first semiconductor region.

15. The semiconductor device according to claim 9, further comprising a buffer layer of the first conductivity type formed between the first semiconductor region and the seventh semiconductor region.

16. The semiconductor device according to claim 9, wherein the second electrode is in contact with both the first semiconductor region and the seventh semiconductor region.

* * * * *